(12) United States Patent
Frank et al.

(10) Patent No.: US 10,795,235 B2
(45) Date of Patent: Oct. 6, 2020

(54) SAW MODULATORS AND LIGHT STEERING METHODS

(71) Applicant: The Charles Stark Draper Laboratory, Inc., Cambridge, MA (US)

(72) Inventors: Ian W. Frank, Arlington, MA (US); Steven J. Byrnes, Watertown, MA (US); Juha-Pekka J. Laine, Boston, MA (US); Gregg E. Favalora, Bedford, MA (US); Joseph J. Register, Cambridge, MA (US); Dennis M. Callahan, Natick, MA (US); Michael G. Moebius, Allston, MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 15/883,802

(22) Filed: Jan. 30, 2018

(65) Prior Publication Data

US 2018/0217473 A1 Aug. 2, 2018

Related U.S. Application Data

(60) Provisional application No. 62/452,281, filed on Jan. 30, 2017, provisional application No. 62/453,041, (Continued)

(51) Int. Cl.
*G02F 1/335* (2006.01)
*G02F 1/11* (2006.01)
(Continued)

(52) U.S. Cl.
CPC ............. *G02F 1/335* (2013.01); *G02F 1/11* (2013.01); *G03H 1/02* (2013.01); *G03H 1/2294* (2013.01);
(Continued)

(58) Field of Classification Search
None
See application file for complete search history.

(56) References Cited

U.S. PATENT DOCUMENTS 3,983,515 A * 9/1976 Mitchell ................. H03H 3/08
333/151
4,027,946 A * 6/1977 Tsai ....................... G02F 1/335
385/36
(Continued)

FOREIGN PATENT DOCUMENTS

EP 2541319 1/2013
WO WO2007062098 5/2007

OTHER PUBLICATIONS

Fattal, D. et al., "A multi-directional backlight for a wide-angle, glasses-free three-dimensional display," Nature, 495: 348-351 (2013).
(Continued)

*Primary Examiner* — Tina M Wong
(74) *Attorney, Agent, or Firm* — HoustonHogle LLP

(57) ABSTRACT

An electro-holographic light field generator device is disclosed. The light field generator device has an optical substrate with a waveguide face and an exit face. One or more surface acoustic wave (SAW) optical modulator devices are included within each light field generator device. The SAW devices each include a light input, a waveguide, and a SAW transducer, all configured for guided mode confinement of input light within the waveguide. A leaky mode deflection of a portion of the waveguided light, or diffractive light, impinges upon the exit face. Multiple output optics at the exit face are configured for developing from each of the output optics a radiated exit light from the diffracted light for at least one of the waveguides. An RF controller is configured to control the SAW devices to develop the radiated exit light as a three-dimensional output
(Continued)

light field with horizontal parallax and compatible with observer vertical motion.

5 Claims, 29 Drawing Sheets

Related U.S. Application Data filed on Feb. 1, 2017, provisional application No. 62/468,455, filed on Mar. 8, 2017.

(51) Int. Cl.

| | | |
|---|---|---|
| G03H 1/02 | (2006.01) | |
| G03H 1/22 | (2006.01) | |
| H03H 9/02 | (2006.01) | |
| H01L 41/09 | (2006.01) | |
| H01L 41/33 | (2013.01) | |
| H01L 41/187 | (2006.01) | |
| G02F 1/03 | (2006.01) | |
| G02F 1/125 | (2006.01) | |
| G02F 1/31 | (2006.01) | |
| G02B 6/00 | (2006.01) | |
| G02F 1/035 | (2006.01) | |
| G02B 6/10 | (2006.01) | |

(52) U.S. Cl.
CPC ......... *H03H 9/02968* (2013.01); *G02B 6/105* (2013.01); *G02B 2006/0098* (2013.01); *G02F 1/0311* (2013.01); *G02F 1/0353* (2013.01); *G02F 1/125* (2013.01); *G02F 2001/311* (2013.01); *G02F 2201/05* (2013.01); *G02F 2201/18* (2013.01); *G02F 2201/30* (2013.01); *G02F 2201/302* (2013.01); *G02F 2201/305* (2013.01); *G02F 2201/307* (2013.01); *G02F 2201/34* (2013.01); *G02F 2202/20* (2013.01); *G02F 2203/023* (2013.01); *G02F 2203/07* (2013.01); *G02F 2203/24* (2013.01); *G02F 2203/28* (2013.01); *G02F 2203/58* (2013.01); *G03H 2001/0224* (2013.01); *G03H 2001/2292* (2013.01); *G03H 2223/16* (2013.01); *G03H 2223/17* (2013.01); *G03H 2223/18* (2013.01); *G03H 2223/23* (2013.01); *G03H 2223/24* (2013.01); *G03H 2225/11* (2013.01); *G03H 2225/21* (2013.01); *G03H 2225/32* (2013.01); *G03H 2225/36* (2013.01); *G03H 2225/55* (2013.01); *H01L 41/09* (2013.01); *H01L 41/1873* (2013.01); *H01L 41/33* (2013.01)

(56) References Cited

U.S. PATENT DOCUMENTS

| | | | | |
|---|---|---|---|---|
| 4,940,304 | A | 7/1990 | Hatori | |
| 5,150,467 | A * | 9/1992 | Hayes | G06F 13/4239 710/107 |
| 5,159,420 | A * | 10/1992 | Grudkowski | B82Y 20/00 257/14 |
| 5,329,397 | A * | 7/1994 | Chang | G02F 1/116 359/285 |
| 5,418,866 | A * | 5/1995 | Chu | G06G 7/195 310/313 B |
| 5,652,809 | A * | 7/1997 | Aronson | G02F 1/125 359/285 |
| 5,657,152 | A * | 8/1997 | Kadota | G02F 1/335 310/313 B |
| 5,706,370 | A * | 1/1998 | Yuki | G02F 1/335 385/10 |
| 6,091,406 | A * | 7/2000 | Kambara | G06F 3/0436 345/177 |
| 6,304,709 | B1 * | 10/2001 | Fujita | G02B 6/266 385/140 |
| 6,404,970 | B1 * | 6/2002 | Gransden | G02B 5/22 385/140 |
| 6,487,342 | B1 * | 11/2002 | Wu | G02B 6/29349 385/23 |
| 6,785,033 | B2 * | 8/2004 | Meyers | G02B 6/266 359/237 |
| 6,810,195 | B2 | 10/2004 | Bhagavatula et al. | |
| 6,875,033 | B2 * | 4/2005 | Sato | G06K 13/0825 439/159 |
| 6,927,886 | B2 | 8/2005 | Plesniak et al. | |
| 7,013,075 | B2 * | 3/2006 | Morimoto | G02B 6/266 385/140 |
| 8,873,131 | B2 | 10/2014 | Han et al. | |
| 9,188,953 | B2 * | 11/2015 | Maeng | G03H 1/02 |
| 10,108,146 | B2 * | 10/2018 | Smalley | G02F 1/011 |
| 10,156,770 | B1 * | 12/2018 | Favalora | G02F 1/335 |
| 10,452,026 | B2 | 10/2019 | Bove, Jr. et al. | |
| 2002/0076151 | A1 * | 6/2002 | Kinard | G02B 6/32 385/33 |
| 2002/0141039 | A1 * | 10/2002 | Mermelstein | G02F 1/125 359/305 |
| 2002/0191264 | A1 * | 12/2002 | Vernackt | G02F 1/11 359/237 |
| 2004/0189146 | A1 | 9/2004 | Ueda et al. | |
| 2004/0263490 | A1 * | 12/2004 | Kent | G06F 3/0436 345/177 |
| 2004/0264907 | A1 * | 12/2004 | Lee | G02B 6/266 385/140 |
| 2005/0213215 | A1 * | 9/2005 | Mitamura | G02B 6/12007 359/589 |
| 2007/0031104 | A1 * | 2/2007 | Chen | G02B 6/266 385/140 |
| 2010/0079831 | A1 | 4/2010 | Renaud-Goud | |
| 2011/0149018 | A1 | 6/2011 | Kroll et al. | |
| 2013/0050788 | A1 | 2/2013 | Maeng et al. | |
| 2013/0202249 | A1 * | 8/2013 | Lefevre | G02B 6/12004 385/14 |
| 2014/0300695 | A1 * | 10/2014 | Smalley | G02F 1/011 348/40 |
| 2015/0182748 | A1 | 7/2015 | Gefen et al. | |
| 2015/0212255 | A1 | 7/2015 | Lai et al. | |
| 2016/0286204 | A1 * | 9/2016 | Grata | G02F 1/33 |
| 2018/0074457 | A1 * | 3/2018 | Jolly | G02B 6/0016 |
| 2018/0284562 | A1 * | 10/2018 | Register | G03H 1/02 |
| 2018/0284563 | A1 * | 10/2018 | Register | G03H 1/02 |
| 2019/0094652 | A1 * | 3/2019 | Byrnes | G02F 1/335 |

OTHER PUBLICATIONS

Maines, J.D., et al., "Surface-Acoustic-Wave Devices for Signal Processing Applications," Proceedings of the IEEE, 64(5): 639-652 (1976).

Savidis, N., et al., "Progress in fabrication of waveguide spatial light modulators via femtosecond laser micromachining," Proc. of SPIE vol. 10115 (2017).

Taillaert, D., et al., "Grating Couplers for Coupling between Optical Fibers and Nanophotonic Waveguides," Japanese Journal of Applied Physics, 45(8A): 6071-6077 (2006).

Jolly, S., et al., "Progress in Transplant Flat-Panel Holographic Displays Enabled by Guided-Wave Acousto-Optics," Proc. of SPIE, 10558: 105580L-1-105580L-7 (2018).

Aieta, F. et al., "Multiwavelength achromatic metasurfaces by dispersive phase compensation," Science. 347 (6228): 1342-1345 (2015).

Byrnes,S., et al., "Designing large, high-efficiency, high-numerical-aperture, transmissive meta-lenses for visible light." Opt. Exp. 24 (5): 5110-5124 (2016).

Geng, J., "Three-Dimensional Display Technologies," Advances in Optics and Photonics, 5: 456-535 (2013).

Hinkov, V.P., et al., "Collinear Acoustoopitcal TM-TE Mode Conversion in Proton Exchanged Ti: LiNbO3 Waveguide Structures," J. Lighwave Tech., 6(6): 903-908 (1988).

(56) References Cited

OTHER PUBLICATIONS

Jolly, S., et al., "Computation of Fresnel holograms and diffraction-specific coherent panoramagrams for full-color holographic displays based on leaky-mode modulators," Proc. SPIE Practical Holography XXIX, 9386, 93860A (2016).
Jolly, S., et al., "Near-to-eye electroholography via guided-wave acousto-optics for augmented reality," Proc. of SPIE vol. 10127 (2017).
Kihm, H., et al., "Nonparaxial Fresnel Diffraction from Oblique End Facets of Optical Fibers," Proc. of SPIE, 5688: 517-524 (2004).
Kulick, J.H., et al., Partial pixels: A Three-Dimensional Diffractive Display Architecture, Josa A, 12(1), 73-83 (1995).
Lucente, M., "Computational Holographic Bandwidth Compression," IBM Systems Journal, 35(3&4): 349-365 (1996).
Matteo, A.M., et al., "Collinear Guided Wave to Leaky Wave Acoustooptic Interactions in Proton-Exchanged LiNbO3 Waveguides," IEEE Trans. Ultrasonics, Ferroelectrics, and Frequency Control, 47(1): 16-28 (2000).
McLaughlin, S., et al., "Optimized Guided-to-Leaky-Mode Device for Graphics Processing Unit Controlled Frequency Division of Color," Applied Optics, 54(12): 3732-3736 (2015).
Onural, L., et al., "New High-Resolution Display Device for Holographic Three-Dimenstional Video: Principles and Simulations," Optical Engineering, 33(3): 835-844 (1994).
Pan, Y., et al., "A Review of Dynamic Holographic Three-Dimensional Display: Algorithms, Devices, and Systems," IEEE Trans. Industrial Informatics, 12(4): 1599-1610 (2016).
International Search Report and Written Opinion of the International Searching Authority, dated Apr. 12, 2018, from International Application No. PCT/US2018/015928, filed on Jan. 30, 2018. 15 pages.
Qaderi, K., et al., "Leaky-Mode Waveguide Modulators with High Deflection Angle for Use in Holographic Video Displays," Optic Express, 24(18): 20831-20841 (2016).
Ryu, G., et al., "Development of Acoustic-Optic (AO) SLM Applicable to 3D Holographic Display," Transducers, 1979-1982 (2017).
Smalley, D.E., et al., "Anisotropic Leaky-Mode Modulator for Holographic Video Displays," Nature, 498: 313-318 (2013).
Smithwick, Q., et al., "Interactive holographic stereograms with accommodation cues," Practical Holography XXIV: Materials and Applications, ed. Hans I. Bjelkhagen and Raymond K. Kostuk, SPIE (2010).
St. Hilaire, P., "Scalable Optical Architecture for Electronic Holography," Optical Engineering, 34(10): 2900-2911 (1995).
Stone, T., et al., "Hybrid Diffractive-Refractive Lenses and Achromats," Applied Optics, 27(14): 2960-2971 (1988).
Tsai, C.S., et al., "Guided-Wave Two-Dimensional Acousto-Optic Scanner Using Proton-Exchanged Lithium Niobate Waveguide," Fiber and Integrated Optics, 17: 157-166 (1998).
Yamaguchi, M., "Light-Field and Holographic Three-Dimensional Displays [Invited]," J. Optical Society of America, 33(12): 2348-2364 (2016).
Zhou, G. et al., "Genetic local search algorithm for optimization design of diffractive optical elements," Appl. Opt., 38(20): 4281-4290 (1999).
Zicker, W., et al., "Antialiasing for Automultiscopic 3D Displays," Eurographic Symposium on Rendering (2006).
International Search Report and Written Opinion of the International Searching Authority, dated Jun. 6, 2018, from International Application No. PCT/US2018/015930, filed on Jan. 30, 2018. 21 pages.
Plesniak, W., et al., "Reconfigurable image projection holograms," Optical Engineering 45(11): 115801-1-115801-15 (2006).
Lee, Y.O, et al., "Toward Effecient Light Diffraction and Intensity Vaiations by Using Wide Bandwidth Surface Acoustic Wave," Japanese Journal of Applied Physics, 55, 06GP04-1-06GP04-8 (2016).
International Preliminary Report on Patentability, dated Aug. 8, 2019, from International Application No. PCT/US2018/015928, filed on Jan. 30, 2018. 9 pages.
International Preliminary Report on Patentability, dated Aug. 8, 2019, from International Application No. PCT/US2018/015930, filed on Jan. 30, 2018. 13 pages.

* cited by examiner

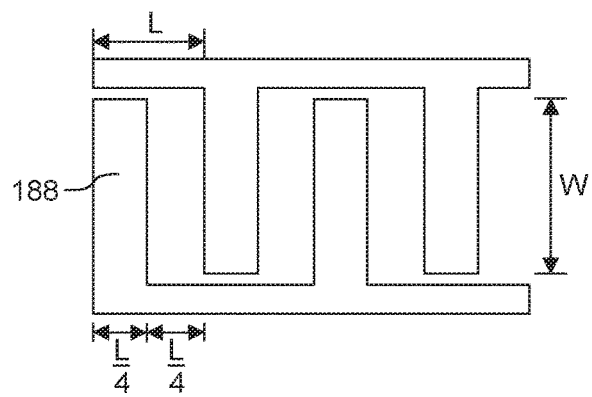
PRIOR ART
FIG. 18A
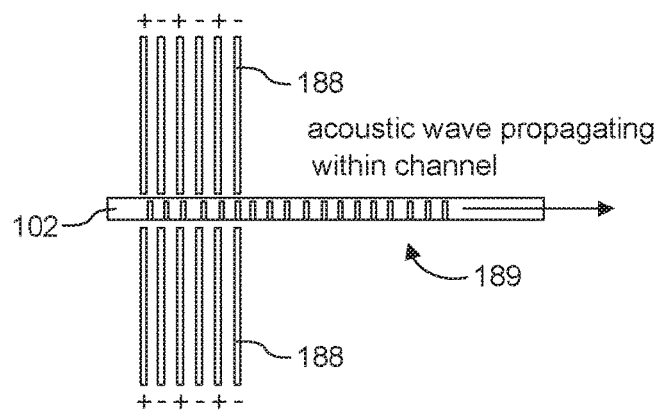
FIG. 18B
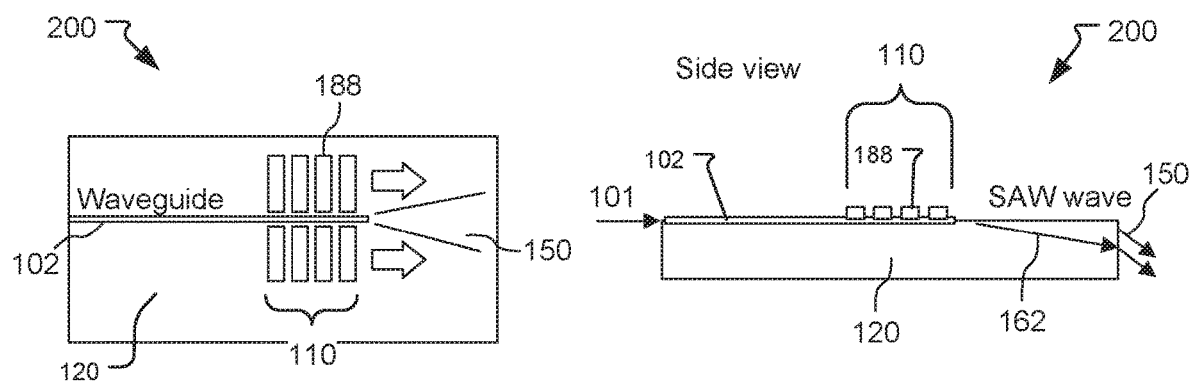
FIG. 18C
FIG. 18D

SAW MODULATORS AND LIGHT STEERING METHODS

RELATED APPLICATIONS

This application claims the benefit under 35 USC 119(e) of U.S. Provisional Application 62/452,281, filed Jan. 30, 2017, U.S. Provisional Applcation 62/453,041, filed Feb. 1, 2017, and U.S. Provisional Application No. 62/468,455, filed on Mar. 8, 2017, which are incorporated herein by this reference in their entirety.

This application is related to:

U.S. application Ser. No. 15/883,811 filed on Jan. 30, 2018, entitled "Electro-Holographic Light Field Generators and Displays," now U.S. Patent Publication No.: 2018-0217414 A1; and International Application number PCT/US2018/015930 filed on Jan. 30, 2018, entitled, "ELECTRO-HOLOGRAPHIC LIGHT FIELD GENERATORS AND DISPLAYS," now International Application Publication No.: WO 2018/140939.

All of the afore-mentioned applications are incorporated herein by this reference in their entirety.

BACKGROUND OF THE INVENTION

Existing three dimensional (3D) display architectures utilize a variety of techniques including scanning, space-multiplexing, and steered illumination, among others. One architecture, electro-holographic displays, relies principally on diffractive phenomena, but it has not yet delivered on the promise of high image quality and compactness. Examples of electro-holographic displays are described in: Jason Geng, *Three-dimensional display technologies,* Advances in Optics and Photonics, 5, 456-535 (2013). (see pp. 508-516) and Yijie Pan et al., *A Review of Dynamic Holographic Three-Dimensional Display: Algorithms, Devices, and Systems,* IEEE Transactions on Industrial Informatics, 12(4), 1599-1610 (August 2016).

A primary disadvantage of existing electro-holographic displays, and their constituent modulators, is their low product of display size and spatial frequency; this product is sometimes called the space-bandwidth product. A large modulator, or a modulator capable of being tiled into a large direct-view display, is desirable because it obviates the need for intermediate scanners or large output lenses. A high spatial fringe frequency is desirable because it increases the field of view of the display: diffraction angle increases with line pairs/mm. Pixel-based spatial light modulators (SLMs) suffer from low space-bandwidth product because they are typically impractically small (with areas on the order of 1 $cm^2$), and have pixels typically much larger than the wavelength of light. Similarly, existing acousto-optical modulators (AOMs) have small deflection angles and small active areas. For example, the MIT Spatial Imaging Group Mark II holographic video display employed 18 mirror-scanned $TeO_2$ AOMs to provide a 30° view angle, an image volume of 150 millimeters (mm)×75 mm×150 mm, and 144 vertical scan lines, as described in St.-Hilaire et al., *Advances in holographic video,* Proc. SPIE 1914, Practical Holography VII: Imaging and Materials, vol. 188, pp. 188-96, (1993).

An alternative to the forgoing optical modulation modalities is a surface acoustic wave (SAW) optical modulator, a device category that provides controllable sub-holograms from which a light field can be constructed. Briefly, in a SAW optical modulator, a waveguide, patterned on an optical substrate, carries a time-varying diffracting region that is formed by index changes due to the substrate's piezoelectric effect under radio frequency (RF) excitation (e.g., at 300 MHz), as described, for example, in Onural et al., *"New high-resolution display device for holographic three-dimensional video: principles and simulations,"* Optical Engineering, vol. 33(3), pp. 835-44 (1994); Matteo et al., *Collinear Guided Wave to Leaky Wave Acoustooptic Interactions in Proton-Exchanged LiNbO3 Waveguides,* IEEE Trans. on Ultrasonics, Ferroelectrics, and Frequency Control, 47(1), 16-28 (January 2000); Smalley et al., *Anisotropic leaky-mode modulator for holographic video displays,* Nature, 498, 313-317 (20 Jun. 2013); U.S. Pat. App. Publ. US 2014/0300695, FULL-PARALLAX ACOUSTO-OPTIC/ELECTRO-OPTIC HOLOGRAPHIC VIDEO DISPLAY.

One type of SAW modulator is the guided-to-leaky-mode device fabricated using lithium niobate as described, for example, in Hinkov et al., *Collinear Acoustooptical TM-TE Mode Conversion in Proton Exchanged Ti:LiNbO3 Waveguide Structures,* J. Lightwave Tech., vol. 6(6), pp. 900-08 (1988); Smalley et al., Anisotropic leaky-mode modulator for holographic video displays, Nature, vol. 498, pp. 313-317 (2013), herein after "Smalley"; McLaughlin et al., *Optimized guided-to-leaky-mode device for graphics processing unit controlled frequency division of color,* Appl. Opt., vol. 54(12), pp. 3732-36 (2015); Qaderi et al., *Leaky-mode waveguide modulators with high deflection angle for use in holographic video displays,* Opt. Expr., vol. 24(18), pp. 20831-41 (2016), hereinafter "Qaderi"; and Savidis et al., *Progress in fabrication of waveguide spatial light modulators via femtosecond laser micromachining,* Proc. of SPIE Vol. 10115, 2017. The surface acoustic wave interacts with input light and thereby causes at least some of the light to change from a guided mode within the waveguide to a leaky mode that exits the waveguide.

A feature of SAW modulators is their inherently diffractive, rather than pixelated, nature, and their potential for high frequency bandwidth, which provides the benefit of higher space-bandwidth product (and, thus, practical combinations of diffractive fan angle and modulator area).

SUMMARY OF THE INVENTION

Existing electro-holographic 3D displays that use SAW modulators have limitations. The exit angle of the fan of light for SAW modulators is typically less than 20 degrees. Thus, embodiments of the present invention augment SAW modulators with optical enhancements that increase the exit angle of the fan of exit light emitted from the SAW modulators.

Additionally, embodiments are also disclosed that include optics for conditioning the light exiting from the modulators. Various optics and locations for the optics are disclosed.

In general, according to one aspect, the invention features a surface acoustic wave optical modulator. The modulator comprises a substrate, a transducer for generating a surface acoustic wave in the substrate, a waveguide in the substrate for guiding radiation through the substrate until the radiation is diffracted from the waveguide by the surface acoustic wave, the radiation exiting the substrate at an exit face. Finally, an optic is provided on this exit face.

In embodiments, the optic is transmissive. It might be a diffractive optic or grating. Another option is a refractive optic, such as a concave lens or convex lens.

In one set of embodiments, the optic is formed on an end face of the substrate. In other cases, the optic is formed on a distal face of the substrate.

In still other cases, an array of the optics is provided.

In many of these cases, the optic is used to increase an exit angle fan of the light from the substrate. Nevertheless, it is helpful to generally condition the exiting light such as to form a beam, focus the light and/or create diverging light.

In general, according to another aspect, the invention features a method for steering light. The method comprises coupling light into a waveguide in a substrate, generating a surface acoustic wave in the substrate that diffracts light from the waveguide, conditioning a light exiting from the substrate with an optic on an exit face of the substrate.

In general, according to another aspect, the invention features a surface acoustic wave modulator. It comprises a substrate, a transducer for generating a surface acoustic wave in the substrate, a waveguide in the substrate for guiding radiation through the substrate until the radiation is diffracted from the waveguide by the surface acoustic wave. The radiation then exits the substrate at an exit face after being reflected by another face of the substrate.

In one example, an edge cut angle of an end face relative to a proximal face of the substrate is obtuse. In this case, the light might exit through a distal face.

In another example, an edge cut angle of an end face relative to a proximal face of the substrate is acute. In this case, the light might exit through the proximal face.

In one embodiment, the light is reflected by an end face is coated to be reflective.

In general, according to another aspect, the invention features a method for steering light. The method comprises coupling light into a waveguide in a substrate, generating a surface acoustic wave in the substrate that diffracts light from the waveguide, and reflecting the light at a face of the substrate to exit at another face of the substrate.

In general, according to another aspect, the invention features a surface acoustic wave modulator. The modulator comprises a substrate having at least two adjacent non-orthogonal faces, a waveguide for transmitting light, and a transducer for generating a surface acoustic wave to diffract light from the waveguide toward one of the faces.

In embodiments, an edge cut angle of an end face relative to a proximal face of the substrate is obtuse or acute. An optic could also be provided on one of the faces.

In general, according to another aspect, the invention features a method for forming a surface acoustic wave modulator. The method comprises forming a substrate and a waveguide in the substrate for transmitting light, providing a transducer for generating a surface acoustic wave to diffract light from the waveguide, and forming the substrate with at least two adjacent non-orthogonal faces.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings:

FIG. 18A is an enlarged top view of the prior art SAW device in FIG. 1A, where the enlarged top view shows a layout of transducer fingers of an interdigital transducer (IDT) within the SAW device;

FIGS. 18B-18G are enlarged views of proposed SAW devices showing different layouts of transducer fingers, where: FIGS. 18B and 18C are cross-sectional top views of a SAW device showing an optical waveguide channel with transducers located on either side of, straddling, the waveguide; FIG. 18D is a cross-sectional side view of the SAW devices in FIGS. 18B and 18C; FIG. 18E is a top cross-sectional view of a SAW device showing several multimode optical waveguide channels patterned within the SAW device; FIG. 18F is a cross-sectional top view of multiple multi-mode waveguide paths within a SAW device that are fed by a common source of illumination; and FIG. 18G is a cross-sectional side view of SAW devices in either of the embodiments of FIGS. 18E and 18F.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is to be understood that many materials and design choices are available to the engineer in implementing the teachings described herein, and all of them are subsumed within the scope of the present invention. Thus, while lithium niobate as a substrate material is discussed, for heuristic convenience, as a suitable material, a person of ordinary skill in the art will appreciate that various materials are available to the engineer, and that lithium niobate is merely exemplary, as are various crystal orientations, such as x-cut and y-cut, and waveguide architectures, such as planar, ridge, rib, embedded, immersed, and bulged. Methods described herein may be advantageously performed using waveguides in y-cut, x-propagating lithium niobate, due to its high efficiency of electrical to mechanical transduction. Doping, such as resulting in MgO-doped lithium niobate, may be employed advantageously, in some cases, to reduce photorefractive damage.

SAW Optical Modulator Architecture

Figure 1A:
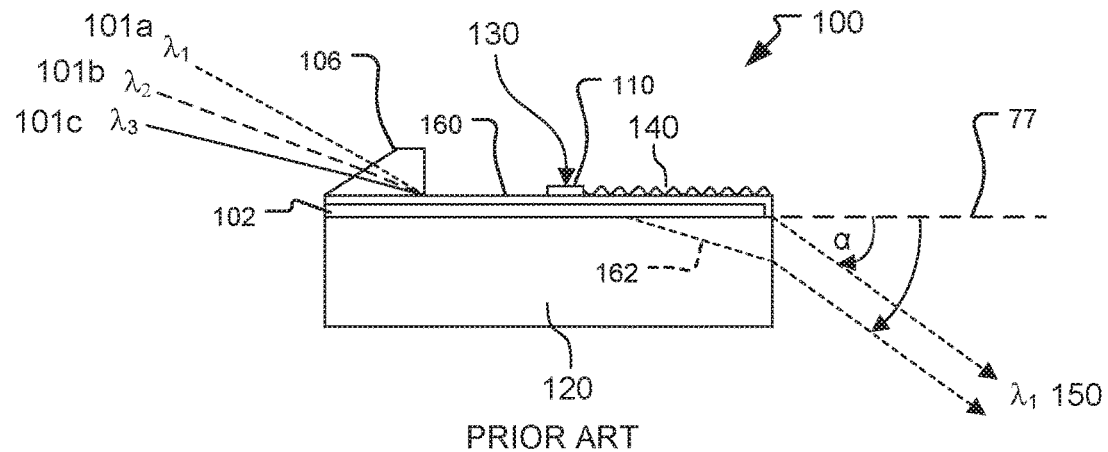
FIG. 1A is a schematic side view of a prior art SAW optical modulator ("SAW device")

FIG. 1A shows an exemplary prior art SAW device or modulator 100. It can be used to deflect light of the same or different colors/wavelengths 101a, 101b, 101c from a guided mode by different angles simultaneously. Due to fabrication, material, and power constraints, the angular range is ordinarily extremely limited, however, largely by the mode overlap between the guided mode and the SAW. As described herein, using either diffractive or refractive optics, there are methods for increasing this angular distribution, in ways that are essentially angle magnifiers.

The device 100 comprises a substrate 120 in which or on which an acousto-optic waveguide 102 has been formed. The input light 101a, 101b, and 101c at one or more wavelengths ($\lambda_1, \lambda_2, \lambda_3$) enters waveguide 102. Typically, an in-coupling device 106 is provided to couple the input light 101 carried in an optical fiber, for example, into the waveguide 102. Examples of in-coupling devices 106 include in-coupling prisms, gratings, or simply butt-coupling techniques between the optical fiber and the waveguide 102. The input light 101 is launched into a guided mode upon entry into the waveguide 102. Commonly, the TE (transverse electric) mode is guided.

In such a SAW device 100, the slab waveguide 102 is typically created in a lithium niobate substrate 120 by proton-exchange. Interdigital transducers 110 are written on an aluminum side of the substrate 120. The transducers 110 induce surface acoustic waves 140 in the substrate 120 that propagate along the waveguide 102. Such transducers 110 are often driven electrically, e.g. using a 300-500 MHz radio frequency (RF) input signal 130.

The light interacts with the surface acoustic wave 140. The result of this interaction between the surface acoustic wave 140 and the light in the waveguide 102 is that a portion of the guided light is polarization-rotated out of the guided mode and into a leaky mode having the transverse magnetic (TM) polarization. The light then exits the waveguide 102 as polarized leaky-mode or diffracted light 162 and enters substrate 120. At some point this diffracted light 162 exits the substrate 120, either through the substrate's side as in FIG. 1A or its bottom as in FIG. 1B, as exit light 150 at an exit angle fan α. The range of possible exit angles comprises the angular extent, or exit angle fan, of the exit light 150.

Due to fabrication, material, and power constraints, the angular range of exit angles α is ordinarily very limited. Qaderi (2016), for example, reports that a total exit angle α of approximately 20° can be achieved, which is significantly lower than the field of view of contemporary 2-D displays that approach 180°.

Figure 1B:
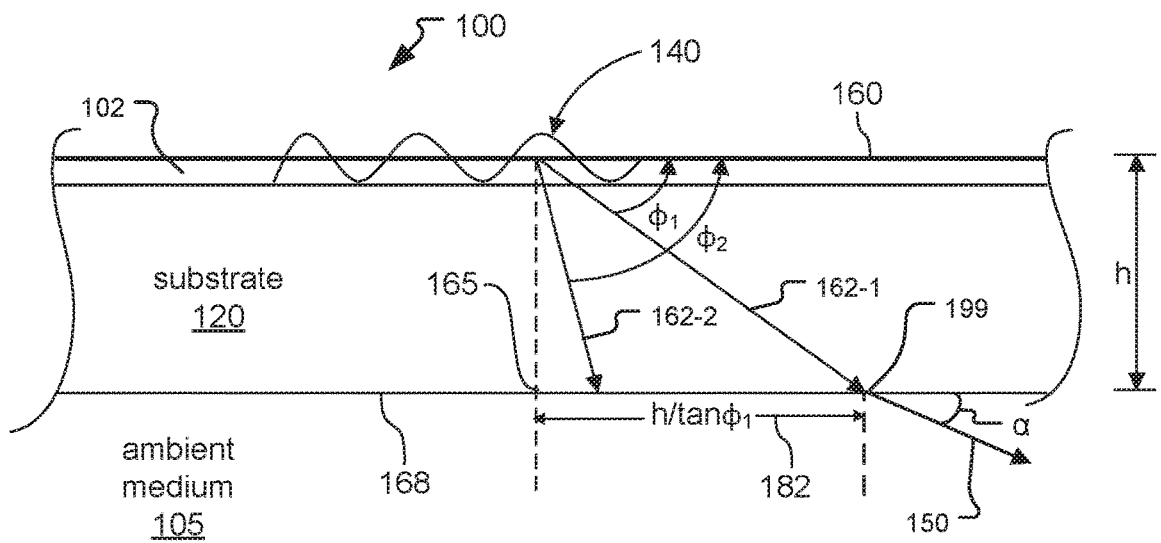
FIG. 1B is a schematic partial side view of a SAW device as in FIG. 1A, illustrating dimensional and angular relationships between beams traversing a substrate of the SAW device.

FIG. 1B shows the relationships between different beams of diffracted light 162 in the SAW device 100 of FIG. 1A to illustrate its limited angular range. Once diffracted from the waveguide 102, the diffracted light 102 propagates through thickness h of substrate 120. Diffracted light 162-1 propagates through the substrate 120 at deflection angle $\phi_1$. The deflection angle $\phi_1$ is measured relative to grazing, such as proximal face 160 of substrate 120. The diffracted light 162 exits distal face 168 of substrate 120 at a distance h/tan $\phi_1$ from the point 165 normal to where the light left the waveguide 102.

Depending on the crystal phase and the values of the overlap integral for the waveguide mode, using a higher or lower RF drive frequency of the RF input signals 130, a higher deflection angle φ may be achieved. This is illustrated by diffracted light 162-2, at deflection angle $\phi_2$ to proximal face 160 of substrate 120. Thus, as might be expected, the finite thickness h of substrate 120 gives rise to a spatial variation of where the beams of diffracted light 162 impinge upon distal face 168 of substrate 120. The distance from the point normal 165 to the point of incidence 199 of diffracted light beam 162-1 on distal face 168 shall be referred to herein as the "finite substrate propagation displacement" 182. This range of possible diffraction angles φ and the corresponding exit angle α, i.e., the exit fan, of the exit light 150 is generally limited due to fabrication, material, and power constraints.

Additionally, the high refractive index contrast between the substrate material forming the SAW modulator and the ambient medium 105 (typically air) leads to significant Fresnel reflections. These Fresnel reflections reduce the wall plug efficiency of modulator 100, and also lead to stray light in a display in which each pixel might include a separate SAW modulator 100, thereby reducing the visual contrast of the imagery. Additionally, there is a possibility of total internal reflection, which prevents the modulator from working at all in certain configurations.

Figure 1C:
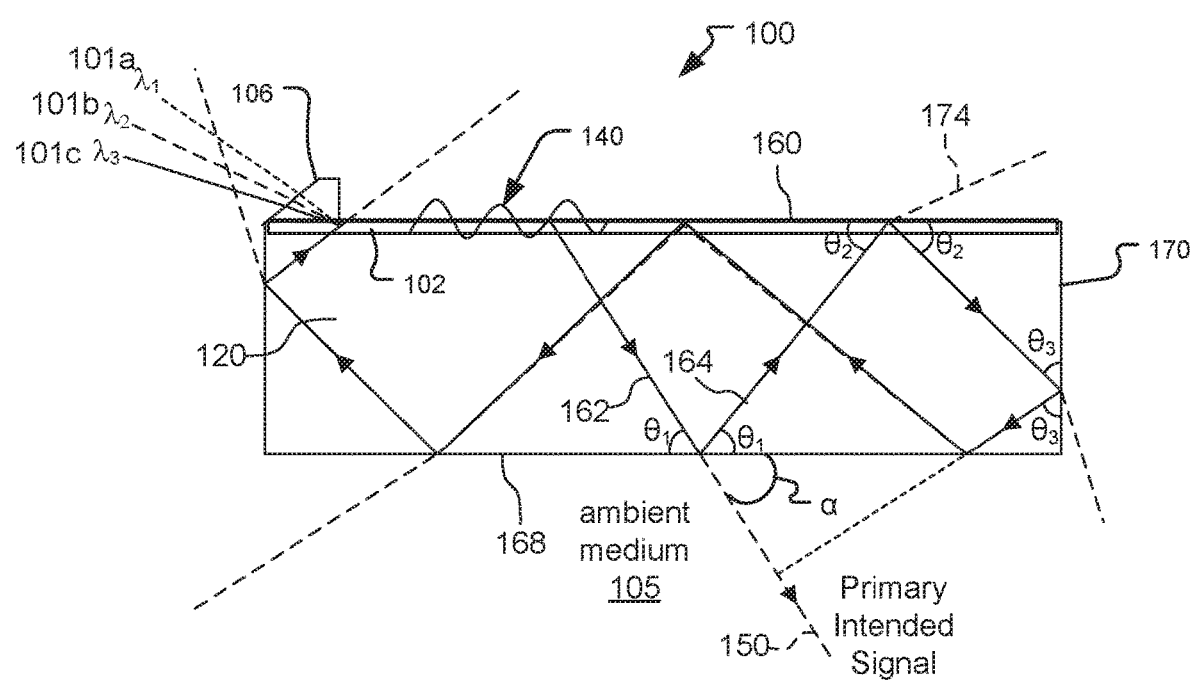
FIG. 1C is a schematic side view of a SAW device as in FIG. 1A, depicting the effects of Fresnel reflections at interfaces of the SAW device.

FIG. 1C illustrates the effect of Fresnel reflections at successive interfaces between substrate 120 of SAW device 100 and ambient medium 105. These Fresnel reflections are indicated in FIG. 1C as Fresnel reflected components 164 and give rise to stray exit light 174 and other problems.

Here, radiation 101 in the form of input light is introduced at in-coupling device 106. Within waveguide 102, the input light 101 is diffracted by the surface acoustic wave 140 as diffracted light 162. The diffracted light 162 impinges upon distal face 168 as an exit face, at an angle $\theta_1$. The diffracted beam 162 is transmitted through the distal face 168 as exit light 150, which exits the substrate 120 through the distal face 168 at exit angle α. The exit light 150 is the primary intended signal to be transmitted out the SAW device 100.

However, the index discontinuity at the distal face 168 will also create a Fresnel reflected component 164. The Fresnel reflected component 164 retraverses the substrate 120, with a portion emitted as stray exit light 174 at proximal face 160, in one example. Several successive reflections are depicted at angles $\theta_2$ and $\theta_3$ at proximal face 160 and end face 170, respectfully, in examples. As a result, stray exit light 174 exits the substrate 120 at unwanted locations and/or output faces.

Existing electro-holographic displays using SAW devices have attempted to increase the angular subtense/exit angle α of the exit light 150 (field of view) in various ways. In examples, these ways include: experimentally optimizing various modulator parameters to increase the useful bandwidth of the RF driver such as waveguide depth and IDT design (in published systems, the output angle is a function of IDT drive frequency); using edge-emitting modulators having "right-angle" edges; doubling the exit angle fan via waveguides on both sides of the wafer, and/or by demagnification (i.e. using a large lens to demagnify an area of numerous modulators to provide a smaller visible display area having larger field of view). But it does not appear that any of these methods are adequate to achieve an exit angle fan such as 30° or more to as high as 90° or more in any sort of flat form-factor. Other conventional approaches are based on building a 3D display using a diffractive lens array including the diffractive-patch version of integral photography such as in J. H. Kulick, et al., *Partial pixels: a three-dimensional diffractive display architecture,* JOSA A, 12(1), 73-83 (1995), and D. Fattal et al., *A multi-directional backlight for a wide-angle, glasses-free three-dimensional display,* Nature 495, p348-351 (21 Mar. 2013); both of which are incorporated herein by reference in their entireties.

Embodiments of the present invention are disclosed herein below that provide improved SAW devices 200. These improved SAW devices increase the angular extent of the exit angle α of the exit light 150 as compared to existing SAW devices 100.

Figure 2A:
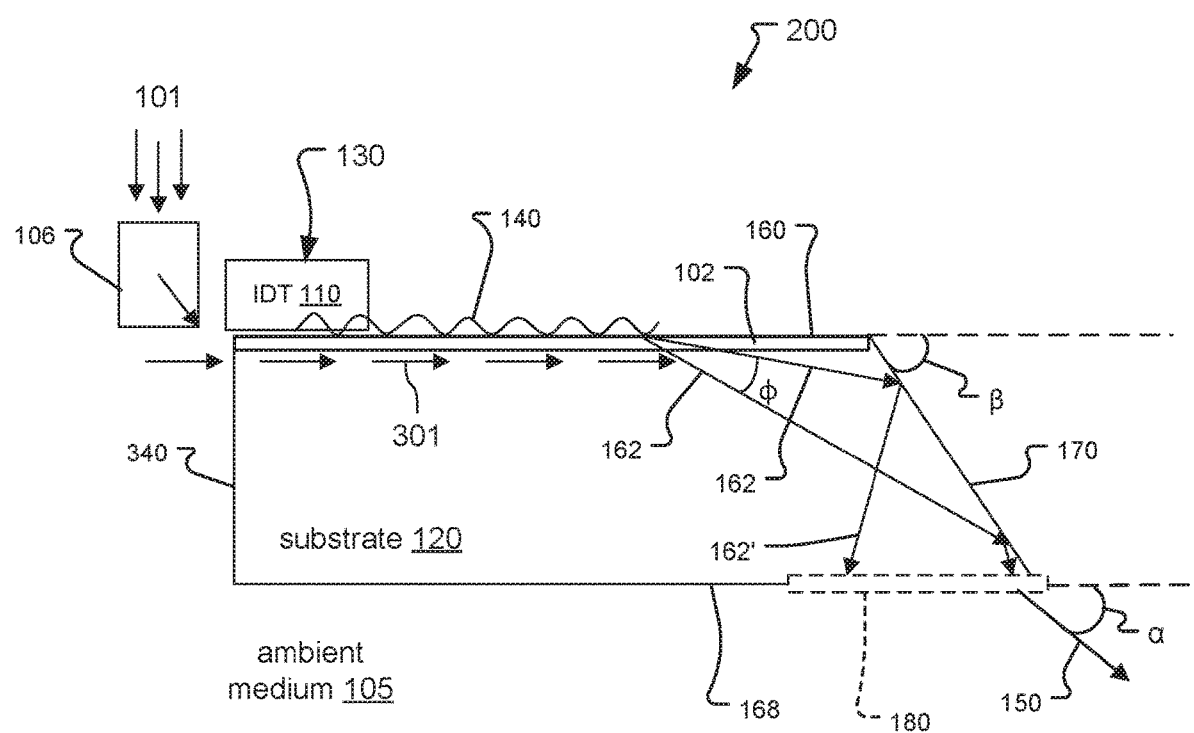
FIG. 2A is a schematic side view of a proposed SAW device having an angled end face as an exit face.

FIG. 2A shows a proposed SAW device 200 utilizing different approaches for increasing the exit angle α of the exit light 150 as compared to prior art SAW devices 100. These approaches include providing an angled end face 170 and/or placing a transmissive optic 180 such as a grating on an exit face of the SAW device 200 to add divergence to the exiting rays of exit light 150.

In more detail, input light 101 enters the substrate 120 via the in-coupling device 106 at the input end 340 and travels through the substrate 120 in the waveguide 102 as a wave of guided light 301. When the surface acoustic waves 140 produced by the interdigital transducer 110 interact with the guided light 301, the light 301 is diffracted and coupled into a leaky mode, which is no longer guided by the waveguide 102. The light of the leaky mode leaves the waveguide 102 and ultimately exits the substrate 120 as exit light 150.

The illustrated SAW device 200 shows a number of innovations that can be used separately or in conjunction with each other in order to improve the performance of the SAW device 200 such as by increasing the divergence of the exiting rays of exit light 150. One of those innovations is a non-orthogonal end face 170. Specifically, in one example, an end face 170 is fabricated or machined at a non-right angle relative to the proximal face 160 and/or the distal face 168 of the substrate 120. A second innovation is to include a transmissive optic 180, such as a diffractive optic or grating or refractive optic, within or upon an exit face, which is the distal face 168 in the illustrated device 200. The transmissive optic 180 might be patterned within/upon the exit faces during fabrication of the SAW device 200, in one example.

In more detail, the end face 170 of the substrate 120 is planar and angled by an edge cut angle β relative to the proximal face 160. The edge cut angle β is measured from the plane of the proximal face 160 to the end face 170. The edge cut angle β is typically chosen such that a deflection of at least half of the available cone of the deflection angle φ, or φ/2, is normal or near normal to the distal face 168 of the substrate 120 after the diffracted light 162 reflects off of the end face 170. Diffracted light 162 that reflects off of an exit face, such as end face 170, is referred to as reflected diffracted light 162'. The reflected diffracted light 162' is then directed toward the transmissive optic 180, such as a grating. In certain embodiments of the invention, a reflective substance such as a metal coating or dielectric coating may be placed on the end face 170 to increase reflectivity and thus the intensity of the reflected diffracted light 162' traveling toward the optic or grating 180. As the light 162' interacts with the grating 180, the light is dispersed, increasing the overall exit angle α of the exit light 150.

In one embodiment, the transmissive optic 180 is a subwavelength grating that is deposited or patterned on or otherwise fabricated on the exit/distal face 168 of the substrate 120 of the SAW device 200. As is well known, a diffraction grating uses perturbations of the refractive index of different materials or dopants, such as: etched grid lines, deposited grid lines, etched holes, deposited cylinders, or other techniques, to alter the k-vector of the light. The standard grating equation states that the spatial frequency of the grating will alter the momentum, such that the following relation holds:

$$k_{initial} - k_{final} = k_{grating}$$

Insofar as the foregoing standard grating equation is a vector equation, it shows that the grating interaction changes the direction of the light.

As discussed above, there is a finite distance, referred to herein as the finite substrate propagation displacement 182 (introduced in connection with FIG. 1B), between where the light is deflected by the surface acoustic wave 140 from the waveguide 102 and where it impinges on the proposed angle-enhancing grating 180. This distance 182 leads to a spatial spread in the exit angle α of the exit light 150 for different deflection angles φ.

Figure 2B:
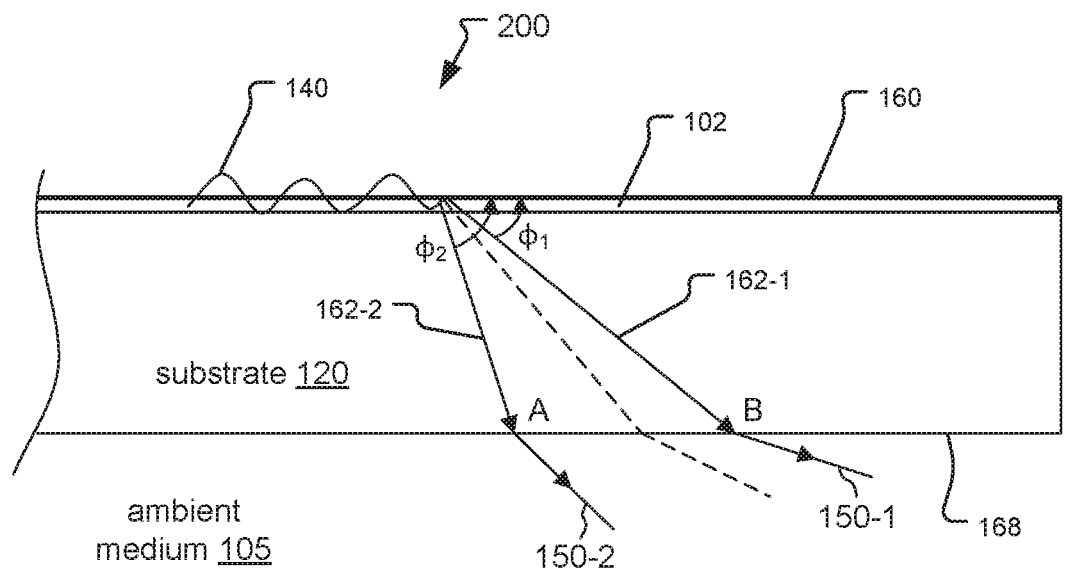
FIG. 2B is a schematic side view of a portion of a proposed SAW device showing extremal deflection angles of diffracted light within the SAW devices and corresponding extremal rays of exit light for the extremal deflection angles, where the extremal rays of exit light in FIG. 2B are emitted at a distal face of the SAW device.
Figure 2C:
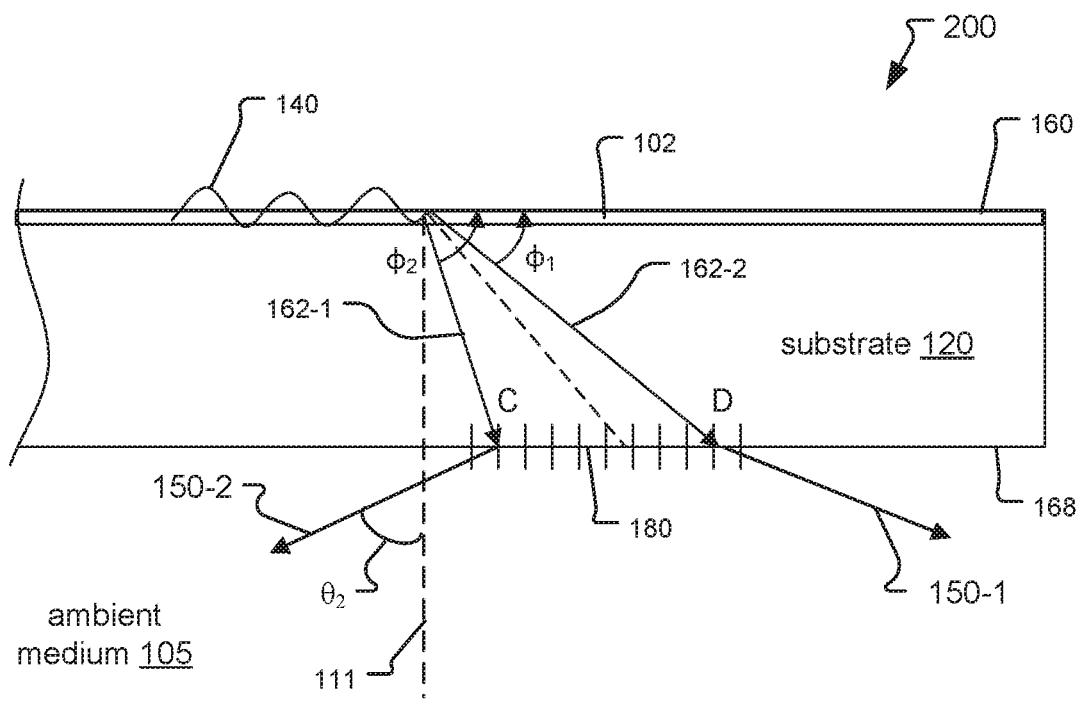
FIG. 2C is a schematic side view of a portion of a proposed SAW device as in FIG. 2B, with the addition of a transmissive optic such as a grating placed at the distal face.

In FIGS. 2B and 2C, on the other hand, when the rays traverse the grating (or other transmissive optic 180), extremal deflection angles $\varphi_1$ and $\varphi_2$ of the diffracted light 162-1 and 162-2 may be mapped to extremal emergent rays of exit light 150-1 and 150-2. In both FIGS. 2B and 2C, $\varphi_1$ and $\varphi_2$ denote the minimum and maximum deflection angles, respectively.

FIG. 2B is a proposed SAW device 200 that does not include a transmissive optic 180. In the absence of a transmissive optic 180, the diffracted light 162-1 and 162-2 impinges upon distal face 168 at points A and B, respectfully. The diffracted light 162-1 and 162-2 are emitted from the distal face 168 as extremal rays of exit light 150-1 and 150-2. Here, the extremal rays of exit light 150-1/150-2 are simply given by Snell's law, as the rays traverse the interface between the refractive index of the substrate 120 (say, n~2.3 for LiNbO3) to that of the ambient medium 105.

FIG. 2C is a proposed SAW device 200 with the addition of the transmissive optic 180, such as a chirped grating. The grating 180 is located at the distal face 168. When diffracted light 162-1 and 162-2 impinge upon points C and D of the grating 180, respectfully, extremal rays of exit light 150-1 and 150-2 are emitted. Here, the extremal rays of exit light 150-1 and 150-2 extend at angles, indicated by theta (θ), from nearly 90° in one direction to 90° in the other direction with respect to the normal 111 to the substrate 120. Exemplary angle $\theta_2$ for extremal ray of exit light 150-2 is shown.

In more detail, the remapping of the diffracted light 162 is accomplished by rearranging the grating equation to obtain angle $\theta_i$ between each emergent ray of exit light 150 (in the first diffraction order) and the normal 111:

$$\theta_i = \arcsin\left(\frac{\lambda}{d} - \frac{\cos\phi_i}{n}\right)$$

where n is the refractive index of the substrate 120, and use is made of the fact that the angle of incidence of a ray deflected toward the transmissive optic 180 is the complement of its angle with respect to the proximal face 160. As a well-known consequence of this equation, any possible emergent ray angle can be created with a suitable choice of spatial frequency of the grating 180 for a specified input angle.

A variation on the technique that has been described is to spatially vary the grating period (the reciprocal of the spatial frequency) along the extent of the grating 180. This spatial variation can be mapped to the incoming deflection angle φ due to finite substrate propagation displacement. For example, the grating frequencies may be chosen so that light hitting the grating at the surface normal 111 is transmitted without additional deflection, whereas light striking the grating 180 at increasingly oblique angles will experience greater and greater deflection. This deflection increases to the point where the maximum angle φ deflected by the surface acoustic wave 140 (for example +10°) will experience an additional deflection due to the exit-surface grating 180, thereby experiencing a total deflection from the normal 111 at or approaching 90°. The variation in angle θ provided by the grating 180 for extremal (e.g. minimum and maximum) deflection angles $\varphi_1$ and $\varphi_2$ has two benefits: it may advantageously allow for the modest initial deflection angles to be amplified, and it may advantageously suppress Fresnel reflections, the undesirability of which has been discussed above with reference to FIG. 1C.

A mirror or other reflective feature can be used to center the "deflection cone" of the surface acoustic wave 140, such that the central value is normal to the grating 180. This may provide symmetric deflection.

A refinement to this technique is to tailor the grating 180 to work equally well at multiple wavelengths, such as red, green and blue (R, G, B) when used for visual display applications. Although R, G, B are referenced here, all other ways of representing color may also be used within the scope of the present invention. The grating may be constructed through optimization to work over the entire color spectrum in one embodiment. This is accomplished through numerical optimization, with the starting point given by the grating equation. The grating layout is then optimized either through genetic algorithms or other well-known numerical methods to produce the highest efficiency and best angular distribution. The actual spatial pattern will depend on the choice of substrate material used for the SAW modulator 200, as well as the maximum and minimum deflection of the surface acoustic wave 140, and the material choice for the grating 180.

A grating in accordance with embodiments of the present invention may be fabricated in any of the following ways, provided as examples and without limitation:

Etching directly into/onto the modulator wafer
Depositing metal dots or lines
Depositing dielectric dots or lines Descriptions of exemplary genetic algorithms and numerical grating optimization techniques may be found in:

Zhou et al., "*Genetic local search algorithm for optimization design of diffractive optical elements,*" Appl. Opt., vol. 38(20), pp. 4281-90 (1999);

Lin et al., "*Optimization of random diffraction gratings in thin-film solar cells using genetic algorithms,*" Solar Energy Materials and Solar Cells, vol. 92(12), pp. 1689-96 (2008);

Qing et al., "*Crowding clustering genetic algorithm for multimodal function optimization,*" Appl. Soft Computing, vol. 8(1), pp. 88-95 (2008);

Taillaert et al., "*Compact efficient broadband grating coupler for silicon-on-insulator waveguides,*" Opt. Lett., vol. 29(23), pp. 2749-51 (2004);

Shokooh-Saremi et al., "*Particle swarm optimization and its application to the design of diffraction grating filters,*" Opt. Lett., vol. 32(8), pp. 894-96 (2007); and Byrnes et al., "Designing large, high-efficiency, high-numerical-aperture, transmissive meta-lenses for visible light." Opt. Exp. 24 (5), pp. 5110-5124 (2016).

Figure 3:
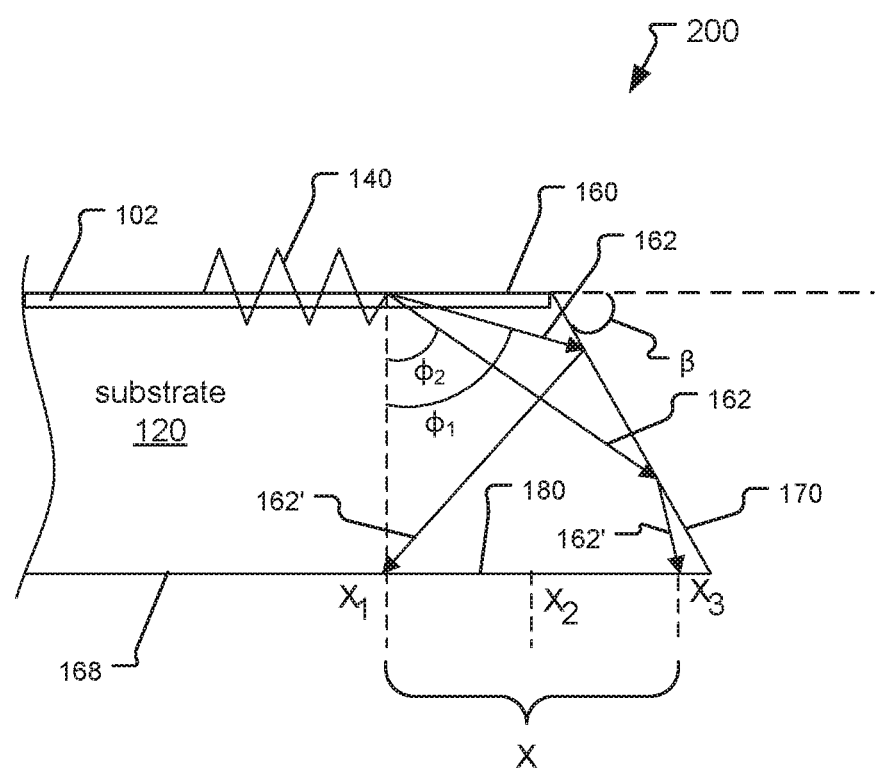
FIG. 3 is a schematic side view of a portion of another proposed SAW device, showing rays of diffracted light transmitting through the substrate of the SAW device and towards a diffraction grating as the transmissive optic, attached to a distal face of the substrate.

FIG. 3 depicts an example of reflected diffracted light 162' incident upon a transmissive optic 180 such as a grating of a proposed SAW device 200. As shown, the deflection is symmetrical about the point $x_2$, which is normal of the exit distal face 168, and the spatial spread of the deflection angle φ is approximately equal to x.

As in FIGS. 2A and 2B, $\varphi_1$ and $\varphi_2$ are the minimum and maximum deflection angles possible for the diffracted light 162. The diffracted light 162 reflects off end face 170 as reflected diffracted light 162'. Here, the edge cut angle β of the end face 170 is typically chosen such that a deflection of at least half of the available cone of the deflection angle φ, or φ/2, is normal or near normal to the distal face 168.

$$\text{Spatial Spread} \to ( = ) \; x$$

$$\text{So Deflection} = \frac{\varphi}{2} =) \text{normal}$$

$$= 0 =) - \frac{\varphi}{2}$$

$$= \varphi =) \frac{\varphi}{2}$$

Figure 4:
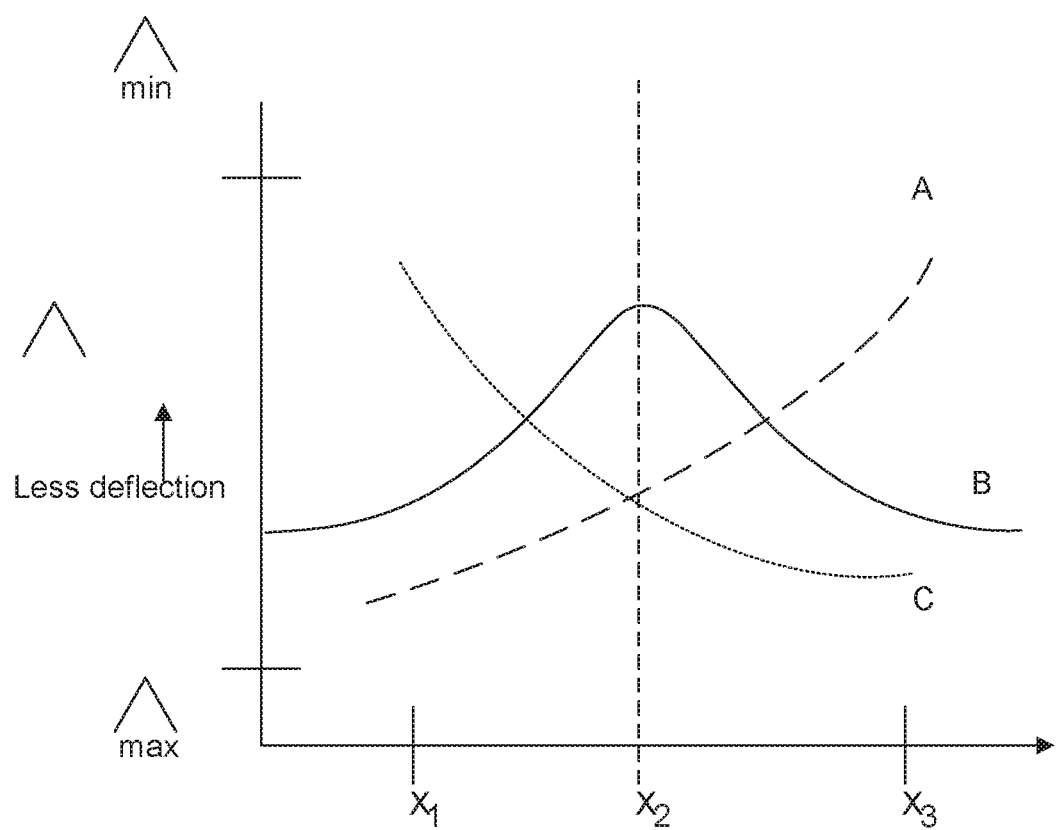
FIG. 4 is a schematic plot of the decreasing spatial frequency/decreasing deflection of the grating as a function of position.

FIG. 4 is a plot of the spatial frequency of the grating 180 shown in FIG. 3 as function of position. As shown, the amount of deflection is symmetric with respect to the distance defined by x (i.e. the size of the grating) in one example. This symmetry is not required in all embodiments of this invention, but is merely illustrative, however.

FIG. 4 is a plot of the spatial frequency for three embodiments of the grating 180 shown in FIG. 3 as function of position. As shown, the amount of deflection is different at different locations within the grating.

Due to finite substrate propagation displacement, different initial deflection angles φ will experience the varying spatial frequencies as depicted in FIG. 4. Thus, more deflection of the diffracted light 162 will occur when the light reaches the grating 180 proximate to points x1, while less deflection will occur at the proximate to the point x3 when the grating is constructed with a spatial frequency according to curve A. The result is an increase in the angular fan of the exit angle α of the exit light 150 beyond that created by initial interaction of the guided light 301 with the surface acoustic wave 140.

On the other hand, when the grating is constructed with a spatial frequency according to curve C, more deflection of the diffracted light 162 will occur when the light reaches the grating 180 proximate to points x3, while less deflection will occur at the proximate to the point x1.

On the other hand, when the grating is constructed with a spatial frequency according to curve B, more deflection of the diffracted light 162 will occur when the light reaches the grating 180 proximate to points x1 and x3, while less deflection will occur at the proximate to the point x2, at the center of the grating.

A second family of techniques to increase the angular extent of the exit angle α of the fan of exit light 150 is to use geometrical optical techniques, i.e. adding or "hollowing-out" diverging optical features on, or near, the SAW modulator 200. These features may be used to increase or decrease the optical power to optimize the fan of the output light.

It should be understood by one of ordinary skill in the art that the various described techniques of creating a refractive lens at an output/exit face, and adding optical power to the system may be done using hybrid diffractive-refractive optics. Such optical systems are generally known to those of ordinary skill in the art and can be found in Stone et al., "*Hybrid diffractive-refractive lenses and achromats,*" Appl. Opt., vol. 27(14), pp. 2960-71 (1988).

Figure 5A:
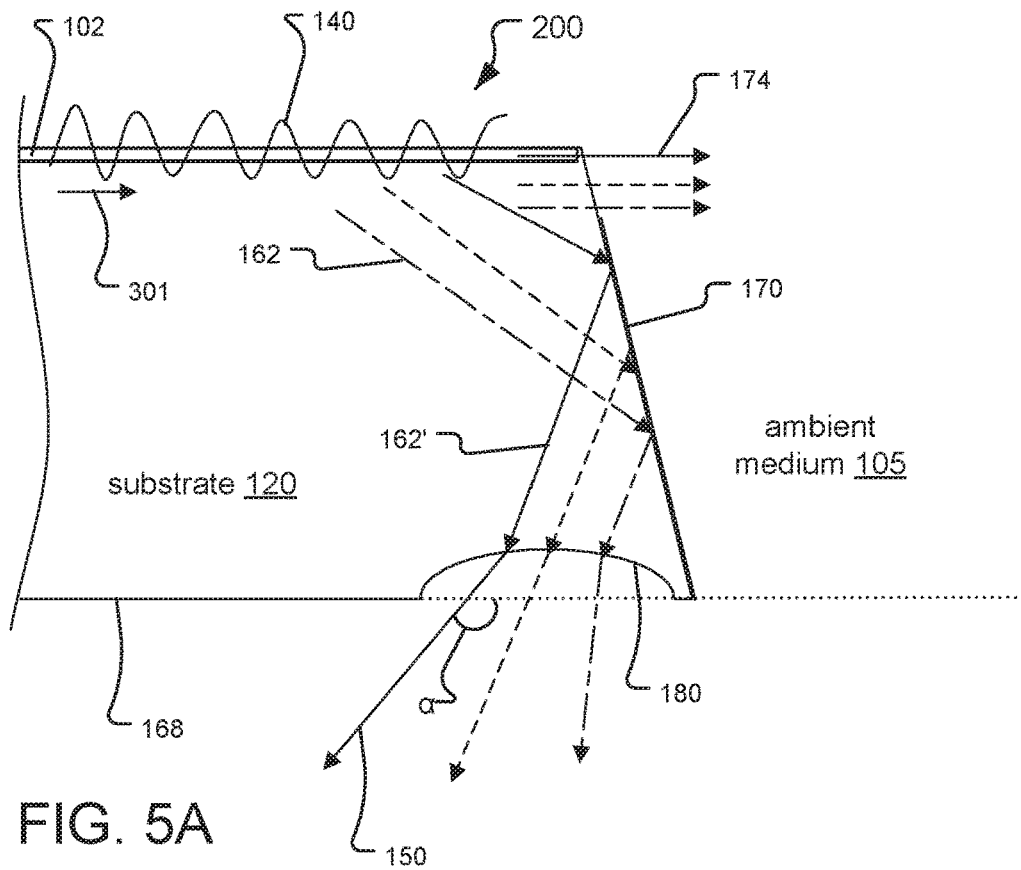
FIGS. 5A and 5B show schematic side views of a portion of other proposed SAW devices that include powered refractive elements, such as a concave optic, to increase the deflection angle, and convex optics.

FIG. 5A is an illustrative example for yet another transmissive optic 180. Here, the optic 180 is formed by removing material from the lithium niobate substrate 120 at the distal face 168 as an exit face to create a concave optical surface 180. The curved optical surface 180 provides diverging optical power, thereby broadening the angular extent of the exit angle α of the fan of exit light 150. In other examples, optical elements that provide the optical power might be placed upon an exit face, patterned flat on a surface such as an exit face, and included as part of a later optical train.

In more detail, the guided light 301 is diffracted from the waveguide 102 by the surface acoustic wave 140 and propagates through the substrate 120 as diffracted light 162. In the illustrated embodiment, this diffracted light 162 is reflected by the end face 170 as reflected diffracted light 162'. As shown, the distal face 168 is made (e.g. patterned) to have a concave optical surface 180 to provide optical power to the wave of reflected diffracted light 162', thus expanding the divergent nature of the light wave. The light wave 162' can then interact with the optical surface 180 to diverge, further creating an exit angle α of greater than 90 degrees.

Due to imperfections in the substrate 120 and differences between the indices of refraction of substrate 120 and ambient medium 105, some of the diffracted light 162 might exit the SAW device 200 as unwanted stray exit light 174 from end face 170. In one example, an opaque layer may be applied to the end face 170 to minimize or eliminate the stray exit light 174.

Figure 5B:
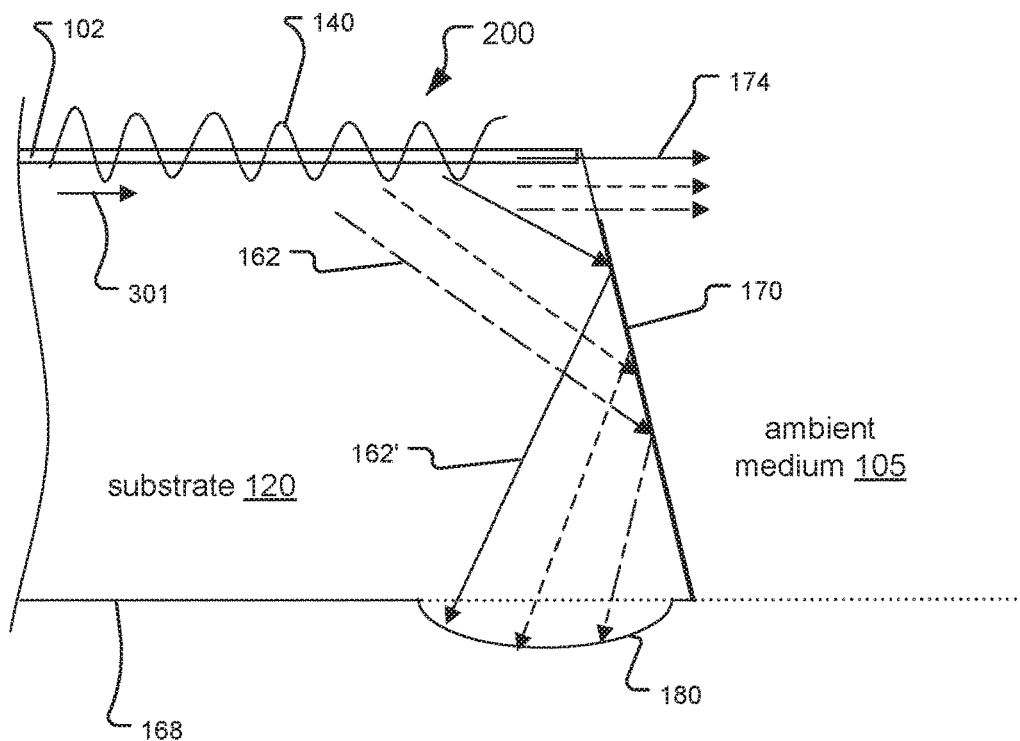

FIG. 5B is another example of the transmissive optic 180. Here, the optic 180 is formed by adding material to the lithium niobate substrate 120 at the distal face 168 as an exit face to create a convex optical surface 180.

Figure 6:
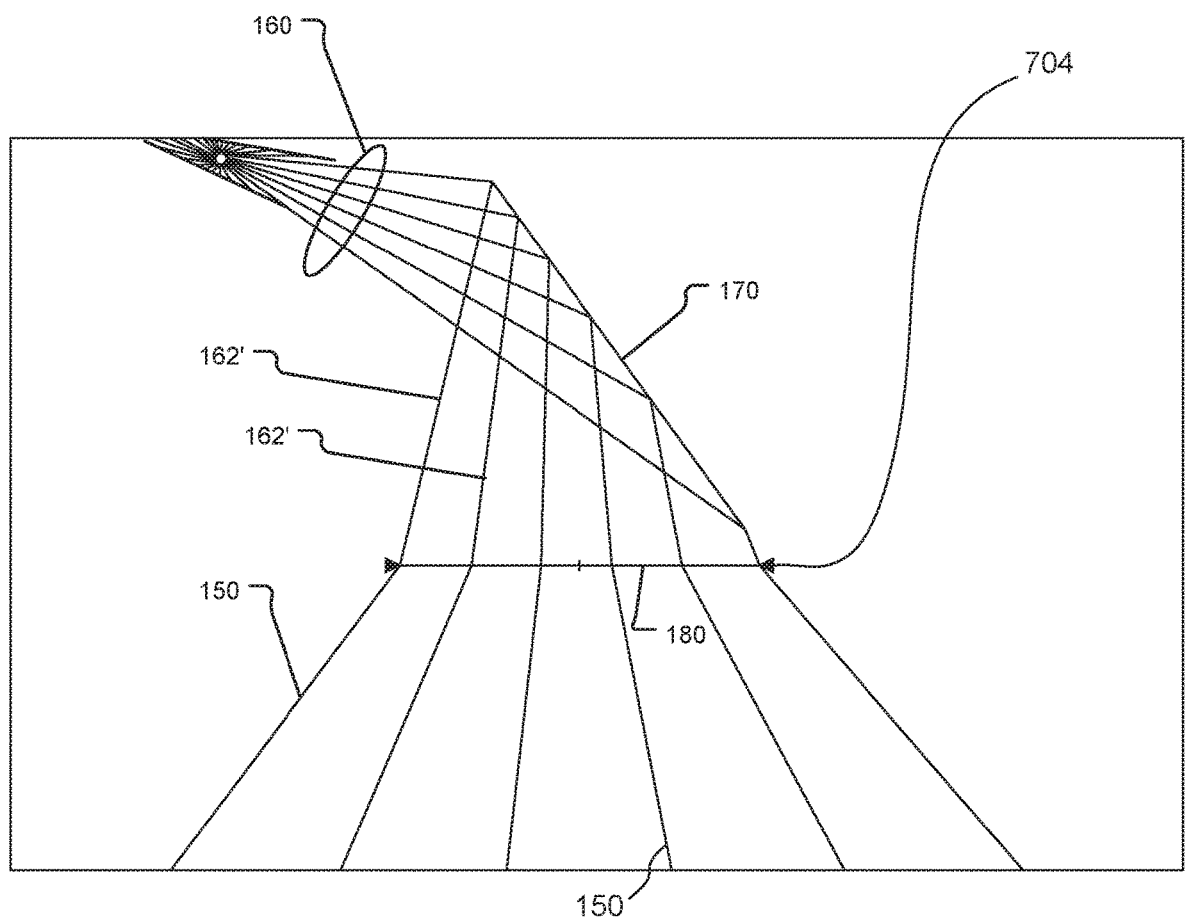
FIG. 6 is a ray trace that shows the rays of radiation of diffracted light and exit light for the SAW device of FIG. 5, and shows how the deflection angle is increased with the use of the grating or the refractive optic.

FIG. 6 shows a ray trace illustrating the propagation of light in the embodiment of the SAW device in FIG. 5. The diffracted light 162 propagates toward the end face 170. This reflects the light 162 as reflected diffracted light 162'. This light 162' then interacts with the transmissive optic 180, which in the illustrated embodiment is a concave optical surface. Other embodiments of the present invention in which the subtense of the exit angle α of the fan of exit light 150 for a SAW modulator 200 might be enhanced are now described with reference to FIGS. 6B and 7A-7N.

Figure 7A:
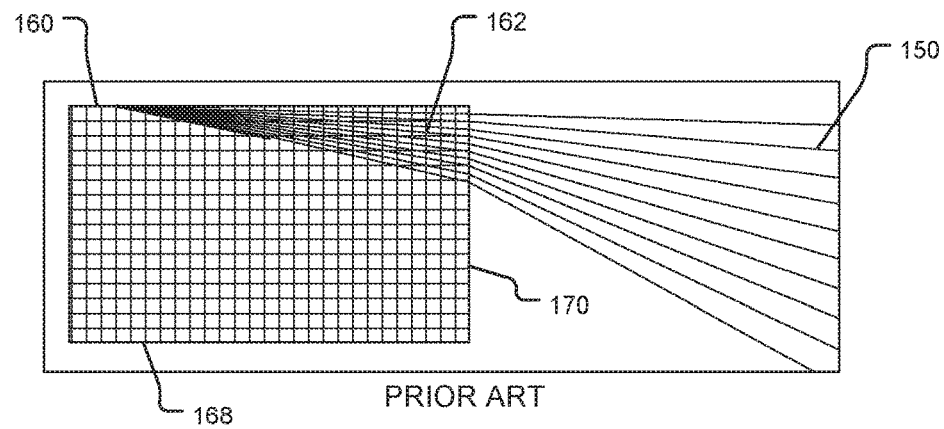
FIG. 7A shows a ray trace of a beam of diffracted light traversing a prior art SAW modulator device.
Figure 7B:
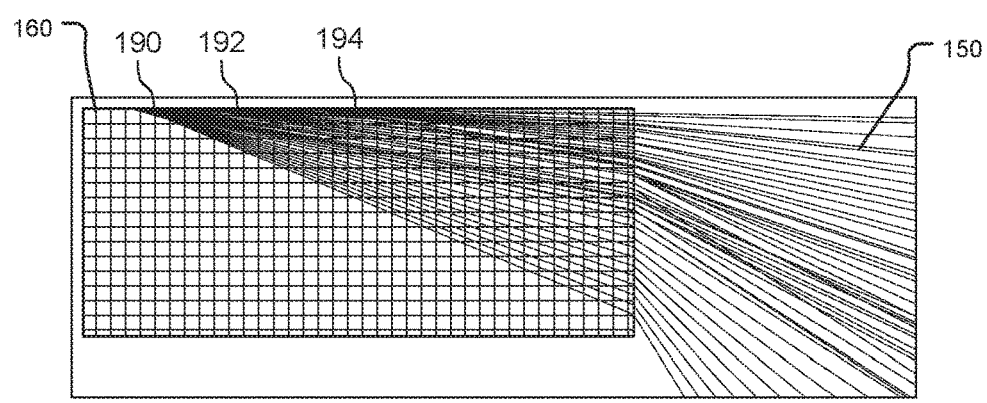
FIGS. 7B-7N show ray traces of beams of diffracted light traversing SAW modulators with different end face geometries according to the present invention.
Figure 7C:
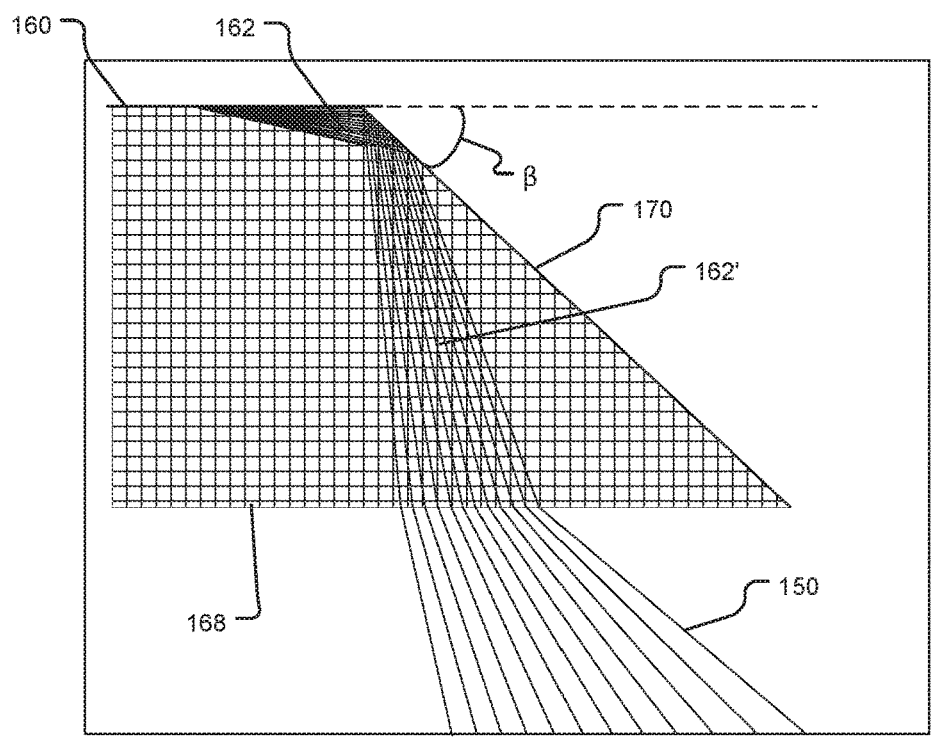
Figure 7D:
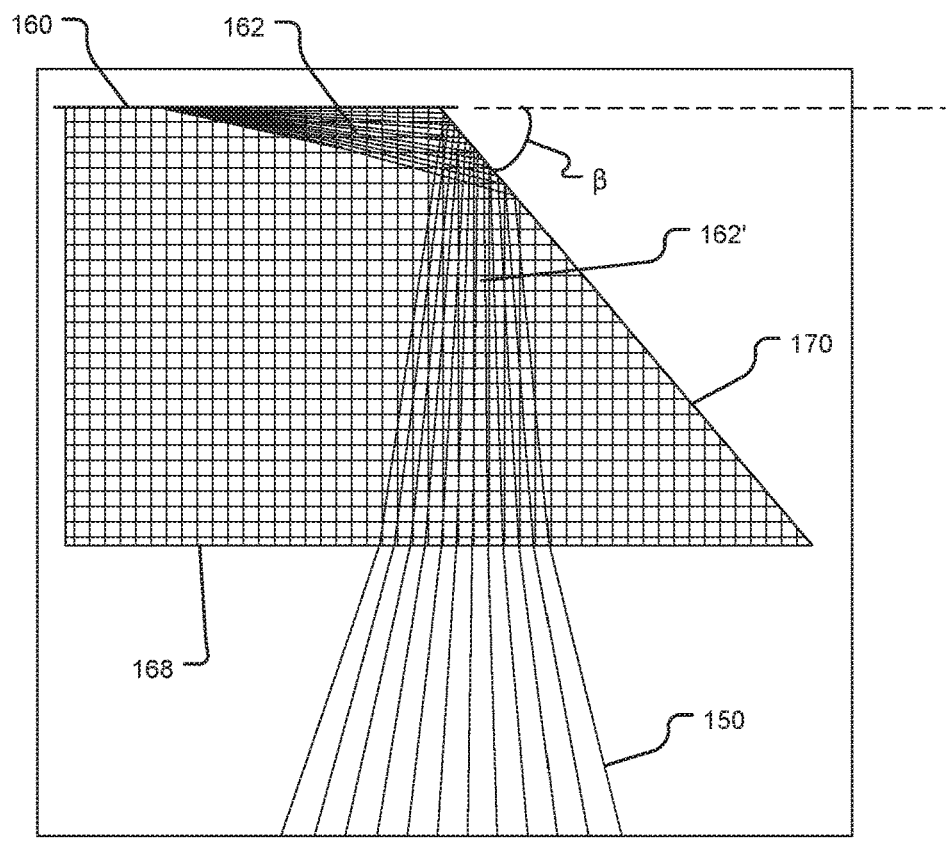
Figure 7E:
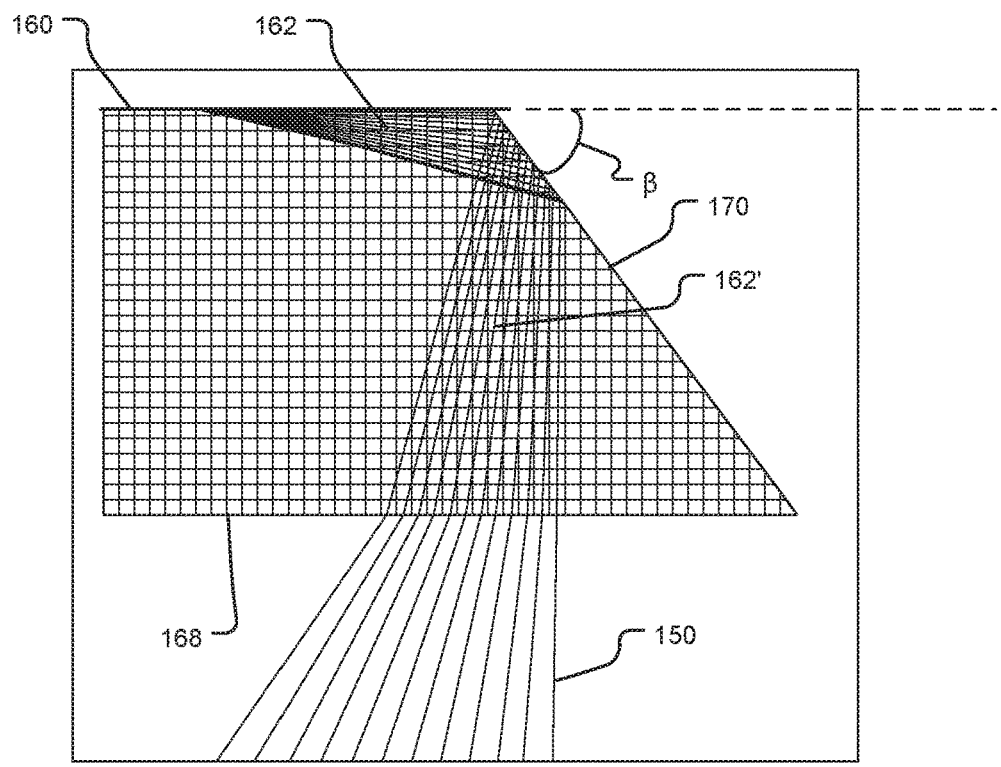
Figure 7F:
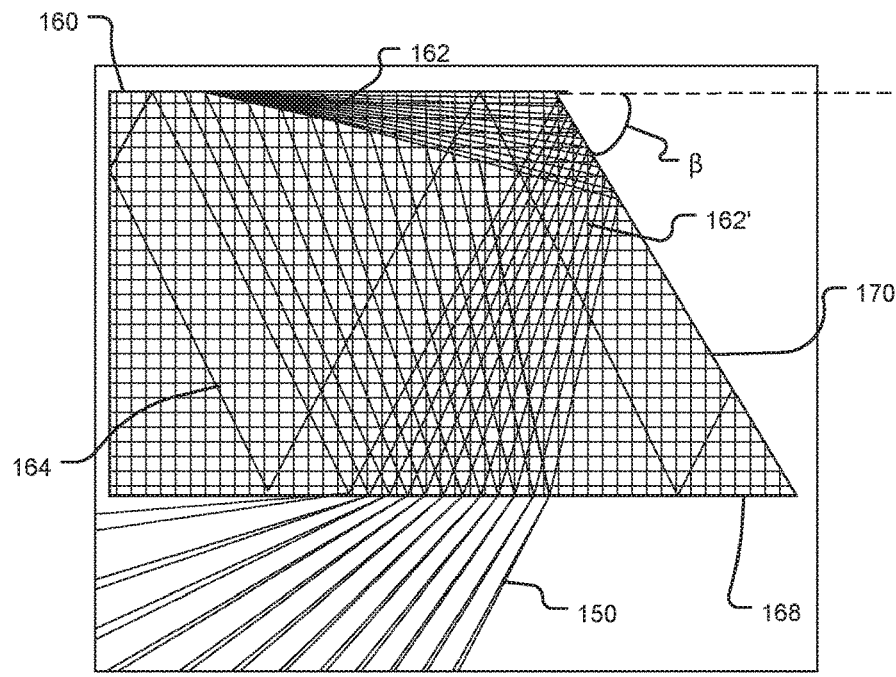
Figure 7G:
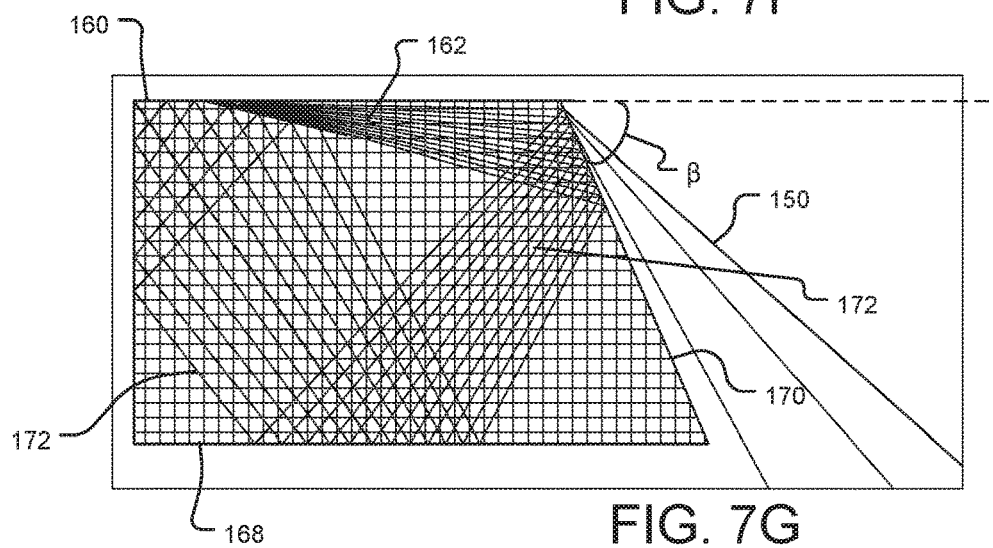
Figure 7H:
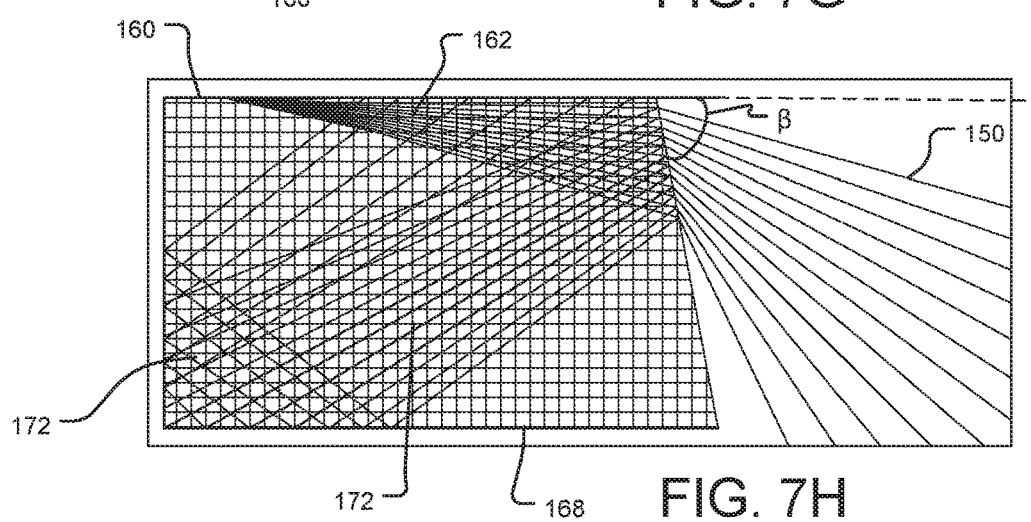
Figure 7I:
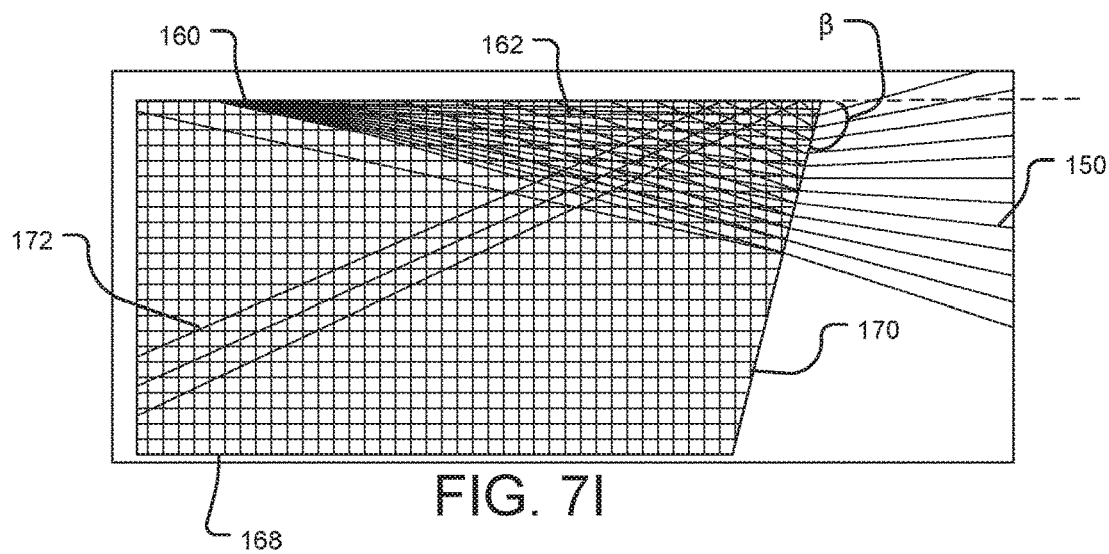
Figure 7J:
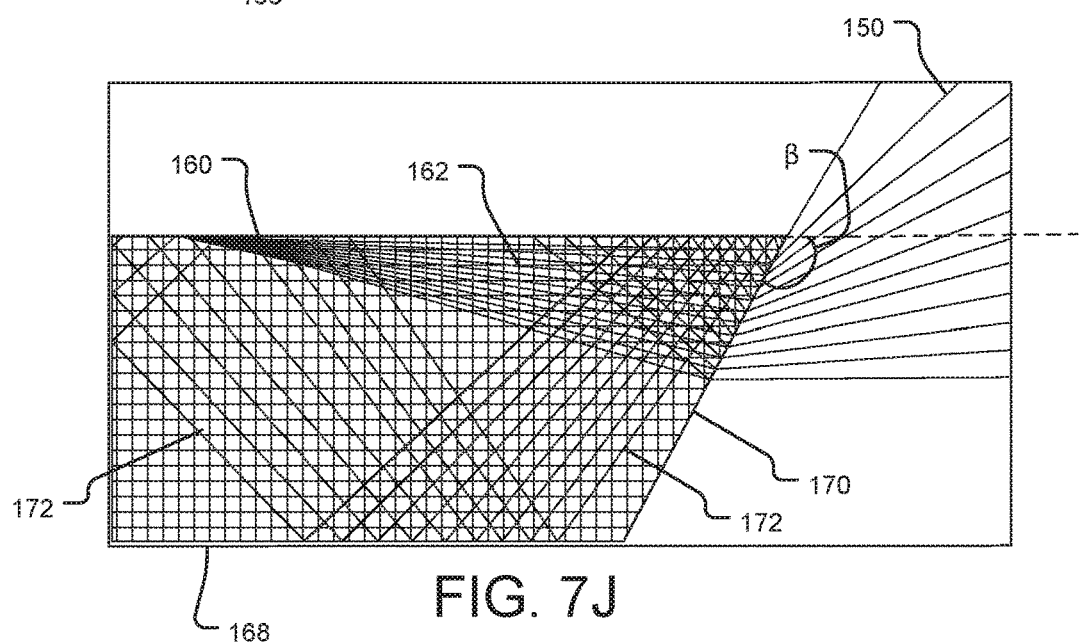
Figure 7K:
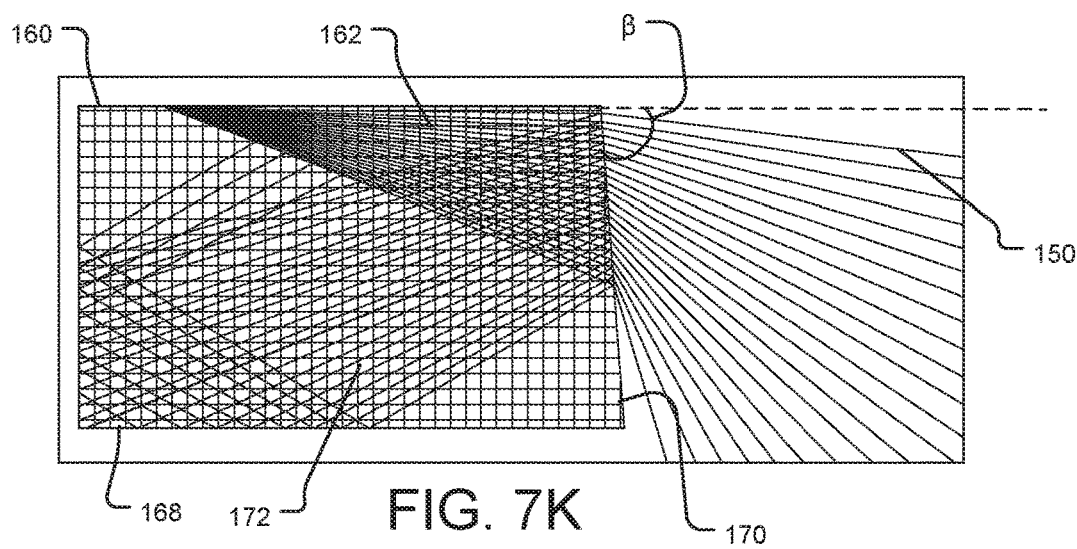
Figure 7L:
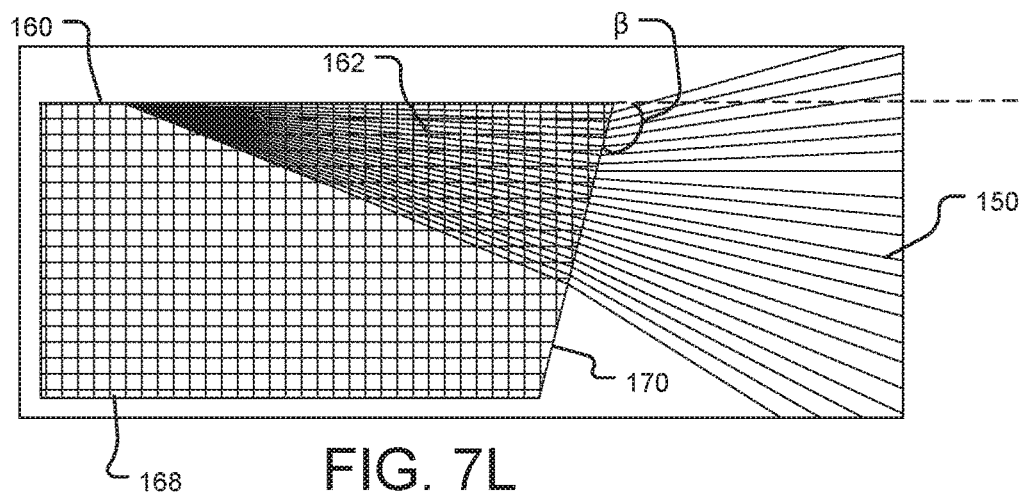
Figure 7M:
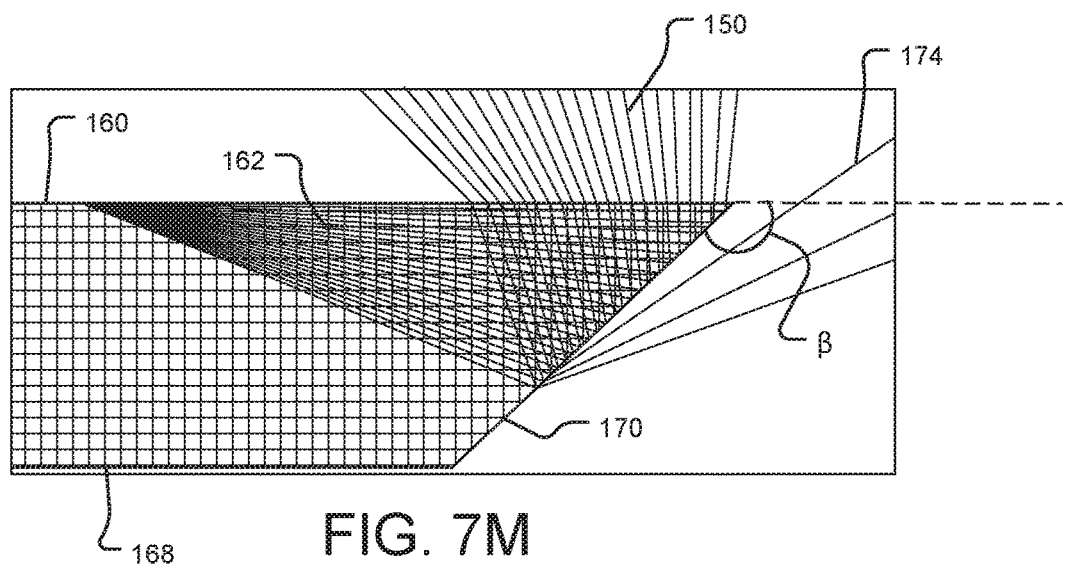
Figure 7N:
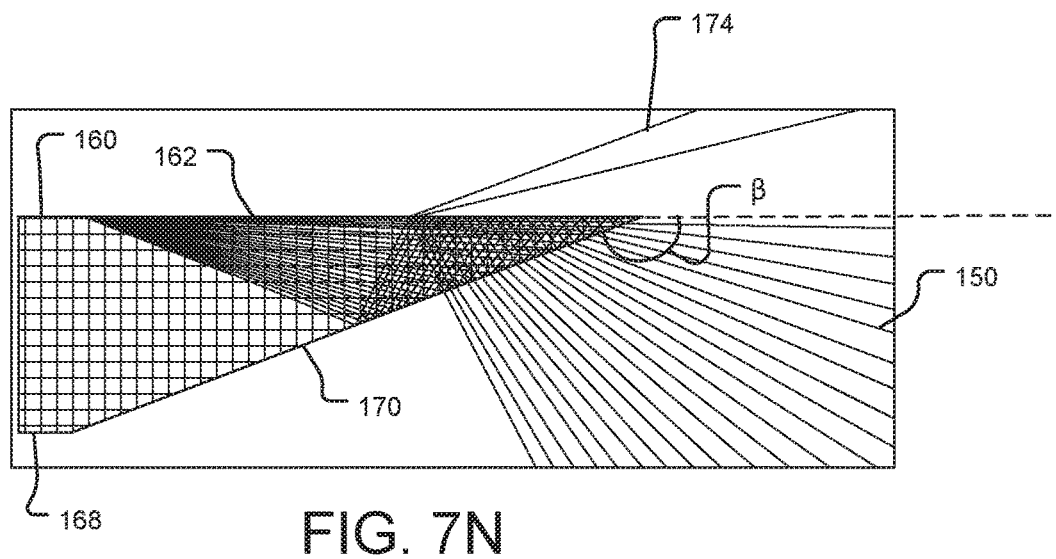

The following table describes each of the ray traces in FIG. 7A-7N. Each row/entry in the table describes a separate ray trace FIG. 7A-7N. Fields within each row includes typical values for the internal deflection angle φ and edge cut angle β, and resulting output angular subtense α. A "comments" field is also included. More detail for each of the ray trace FIGS. 7A-7N accompanies the descriptions of these figures, provided herein below.

However, the effect of such an AR coating can be readily calculated, given the indices of refraction of substrate 120 and ambient medium 105. The AR coating would typically be applied, insofar as an AR coating is beneficial, as elsewhere discussed herein.

FIG. 7A is a base ray trace example, in accordance with the prior art. End face 170 is at a 90° edge cut angle β with respect to the proximal face 160. A typical value for the deflection angle φ is 10°. Here, the diffracted light 162 exits near orthogonal to end face 170 as exit light 150.

FIGS. 7B-7N depict exemplary ray traces in proposed SAW devices 200 constructed according to embodiments of the present invention.

| FIG. | Internal Angle (φ°) | Edge Cut Angle (β°) | Approx. Output Exit angle fan or Subtense (α°) | Comments |
|---|---|---|---|---|
| 7A | 10 | 90 | 25 | Base case, showing one small active area as possible subset of grating. Diffractive structure on top face (e.g., SAW or other grating). Right-angle edge face. |
| 7B | 10 | 90 | Varies | Base case, illustrating diffractive fan as modulated by three regions along, e.g., a SAW. |
| 7C | 10 | 40 | 40 | Exits face opposite modulator channel. Grazing beam exits approximately normal to exit face. |
| 7D | 10 | 50 | 35 | Exits face opposite modulator channel. Edge cut to position median diffracted ray normal to output. |
| 7E | 10 | 52 | 33 | Exits face opposite modulator channel. Edge cut to position maximally diffracted ray to exit normal. |
| 7F | 10 | 60 | ~60 | Exits face opposite modulator channel. Edge cut so that grazing ray just misses total internal reflection (TIR) at exit face. |
| 7G | 10 | 63 | N/A | Edge cut so that grazing ray just avoids TIR, and exits the edge face. |
| 7H | 10 | 80 | ~35 | Edge cut so that the maximally-diffracted ray just misses TIR and exits nearly grazing to the output edge. |
| 7I | 10 | 100 | 30 | Exits edge. Edge cut to make central diffracted ray exit normal to edge face. |
| 7J | 10 | 120 | (example) | Exits edge. Edge cut such that grazing input ray just missed TIR condition. |
| 7K | 20 | <90 (89) | ~90 | Exits edge. Diffraction period and edge angle chosen such that the output subtends approximately 90 degrees. |
| 7L | 20 | 105 | 50 | Exits edge. Median ray exits normal to exit face. |
| 7M | 20 | 140 | (example) | Single-reflection TIR. Fan exits same face as diffracting structure (SAW). |
| 7N | 20 | 160 | (example) | Double-reflection TIR. Fan exits edge face. |

It is to be understood that, within the scope of certain embodiments of the present invention, that the various faces may serve as the exit face, either with an intervening reflection at a face or without. It is also to be understood that the length of the SAW modulator 200 and/or the proximal face 160 and/or distal face 168 may be varied within the scope of the present invention. Additionally, either end face 170 and/or distal face 168 may be cleaved and/or polished or otherwise angled, within the scope of the present invention. For example, the wafer containing the SAW devices 200 may be lapped at an angle. All techniques for fabricating a SAW modulator 200 with faces at non orthogonal angles are within the scope of the present invention. Also, the interaction region (the places where the SAW and the light interact and kick out the leaky mode light) has a finite extent, e.g. 4 mm, 8 mm. A consequence of this, the values the exit angle fan or subtense are generally approximations.

Ray traces are shown, by way of example only, for a variety of geometrical configurations of SAW modulator 200 in FIGS. 7A-7N, and are by no means intended to limit the application of the principles taught herein. FIGS. 7A-7N assume the absence of an anti-reflective (AR) coating.

FIG. 7B illustrates a fan of exit light 150 that is diffracted at regions 190, 192, 194. There is a finite interaction region along which the waveguided light interacts with the SAW to become leaky-mode light. This illustrates an interaction region from 190 to 194, with an intermediate point 192 shown. If a single-frequency RF signal drives the IDT, there is essentially one "ray" emitted at each of 190, 192, and 194, and at intermediate points. This "fills" the output face in this illustration. As in FIG. 7A, the end face 170 is at a 90° edge cut angle β with respect to the proximal face 160. A typical value for the deflection angle φ is 10°. Here, the exit angle fan α is defined as approximately the maximum subtense of the steered light, in air and varies due to the modulation.

FIG. 7C-7H are ray traces for SAW devices 200 having an acute edge cut angle β. In each of FIG. 7C-7H, a typical value for the deflection angle φ is 10°.

FIG. 7C shows a ray trace in which the diffracted light 162 reflects off of the end face 170 as reflected diffracted light 162'. This end face 170 has an edge cut angle β of about 40°. Then, the reflected diffracted light 162' propagates through the substrate 120 towards the distal face 168, which functions as the exit face. The reflected diffracted light 162' exits the SAW device 200 as exit light 150, approximately normal to the distal face 168. Here, an exemplary value for the exit angle fan α is as high as 40°.

FIG. 7D shows a similar configuration as in FIG. 7C. The diffracted light 162 reflects off the end face 170 as reflected diffracted light 162'. Here, however, the end face 170 is at a greater edge cut angle β to the proximal face 160, such as about 50°. This has the effect of changing the general direction of the exit light 150 with respect to the distal face 168. Specifically, the end face 170 is edge cut to position median diffracted rays of the reflected diffracted light 162' to be normal to the distal face 168 as the exit face. The reflected diffracted light 162' is transmitted out the distal face 168 as exit light 150. Here, an exemplary value for the exit angle α is as high as 35°.

FIG. 7E shows a similar configuration as in FIG. 7D. Here, however, the exit face 170 is at a greater edge cut angle β to the proximal face 160, such as about 52°. This has the effect of further changing the general direction of the exit light 150. Specifically, the end face 170 is edge cut to position maximally diffracted rays of the reflected diffracted light 162' to be normal to the distal face 170 as the exit face. Here, an exemplary value for the exit angle fan α is as high as 33°.

FIG. 7F shows a similar configuration as in FIG. 7E. Here, however, the end face 170 is at a still greater edge cut angle β to the proximal face 160, such as about 60°. This has the effect of further changing the general direction of the exit light 150. Specifically, the end face 170 is edge cut so that grazing rays of the reflected diffracted light 162' just miss being totally internally reflected (TIR) at the end face 170, but instead are emitted near the Brewster angle, thus minimizing undesirable Fresnel reflections. The reflected diffracted light 162' exits the SAW device 200 at distal face 168 as exit light 150, approximately normal to the distal face 168. Here, an exemplary value for the exit angle α is approximately 60°. Also shown is a Fresnel reflected component 164 arising at the distal face 168.

The Fresnel reflected component 164 can be addressed. In one example, this component is preferably minimized by adding an AR coating to the distal face 168 to minimize or possibly eliminate the Fresnel reflected component 164.

FIG. 7G shows a similar configuration as in FIG. 7F. Here, however, the end face 170 is at a greater edge cut angle β to the proximal face 160, such as about 63°. This has multiple effects. First, not all of the diffracted light 162 is transmitted out the end face 170 as exit light 150. Rather, some of the diffracted light 162 is reflected internally as stray internally reflected light 172. Second, when the stray internally reflected light 172 impinges on the distal face 168, the stray internally reflected light 172 is totally internally reflected.

The stray internally reflected light 172 can also be corrected. In one example, an antireflective (AR) coating might be applied to the exit face (here, end face 168) to minimize or possibly eliminate the stray internally reflected light 172. Further, an absorber material should be added to the distal face 168 to absorb light reflected light and prevent further stray light reflections.

FIG. 7H shows a similar configuration as in FIG. 7G. Here, however, the exit face 170 is at a greater edge cut angle β to the proximal face 160, approaching 80°. As in FIG. 7G, some of the diffracted beam 162 is reflected internally as stray internally reflected light 172 and is totally internally reflected at the distal face 168. Here, an exemplary value for the exit angle fan α is approximately 35°.

FIGS. 7I-7N are described below and show various combinations of internal reflections and exit angles α for additional edge cut SAW devices 200. In this group of figures, with the exception of FIG. 7K, the edge cut angle β is obtuse.

In more detail, in FIG. 7I, the end face 170 is edge cut to make centrally diffracted light 162 exit normal to the end face 170 as exit light 150. Some of the diffracted light 162 might also be reflected internally as stray internally reflected light 172. The edge cut angle β is about 100° and provides an exit angle α of approximately 30°. A typical value for the deflection angle φ is 10°.

In FIG. 7J, the end face 170 is edge cut such that grazing input rays just miss the TIR condition at the end face 170. The diffracted light 162 exits the end face 170 as exit light 150. The edge cut angle β is about 120° and the exit angle α varies, as shown.

In FIG. 7K, the diffraction period and edge cut angle β are chosen such that the exit angle α is approximately 90 degrees. The diffracted light 162 exits the end face 170 as exit light 150. Here, the edge cut angle β is typically less than 90° (a value of 89° was selected here). A typical value for the deflection angle φ is 20°.

According to FIG. 7L, median rays of the diffracted light 162 exits normal to the end face 170 as exit light 150. Here, the edge cut angle β is 105° and the output angular subtense α is typically 50°. A typical value for the deflection angle φ is 20°.

In FIG. 7M, a single-reflection-TIR case is shown. The diffracted light 162 exits as exit light 150 from the same exit face (here, proximal face 160) as the SAW propagates along. Here, the edge cut angle β is 140°. Unwanted stray exit light 174 is also transmitted out of end face 170. A typical value for the deflection angle φ is 20°.

FIG. 7N shows a double-reflection TIR case. The diffracted light 162 exits the edge face 170 as exit light 150. Here, the edge cut angle β is 160°. Unwanted stray exit light 174 is also transmitted out of proximal face 160. A typical value for the deflection angle φ is 20°.

It is to be understood that antireflective (AR) coatings are preferred at the exit faces of the SAW modulator 200, given the Fresnel reflections due to the typically large discontinuity of index of refraction between substrate 120 and the ambient medium 105. The design of antireflective coatings for the spectral and angular ranges involved here is well within the capabilities of a person of ordinary skill in the art, as is calculating the effect of coating the face on the emerging fan. All antireflective coating techniques are within the scope of the present invention.

When assembled into a display operating in a horizontal-parallax-only mode (i.e. the diffracted fans steer horizontally), it is often also desirable to spread the beams of diffracted light 162/reflected diffracted light 162' vertically. This is typically done with a vertical diffuser. Such methods may be applied, within the scope of the present invention, to all of the embodiments discussed above. Moreover, all of the foregoing teachings may also be applied for vertical displacement. Thus, if the beams 162/162' exit the narrow edge of exit face 170, the narrow edge may be augmented with a transmissive optic 180, such as a lens or a grating, as taught above, to further condition the exit light 150.

Electro-holographic light field generator device architecture

Figure 8A:
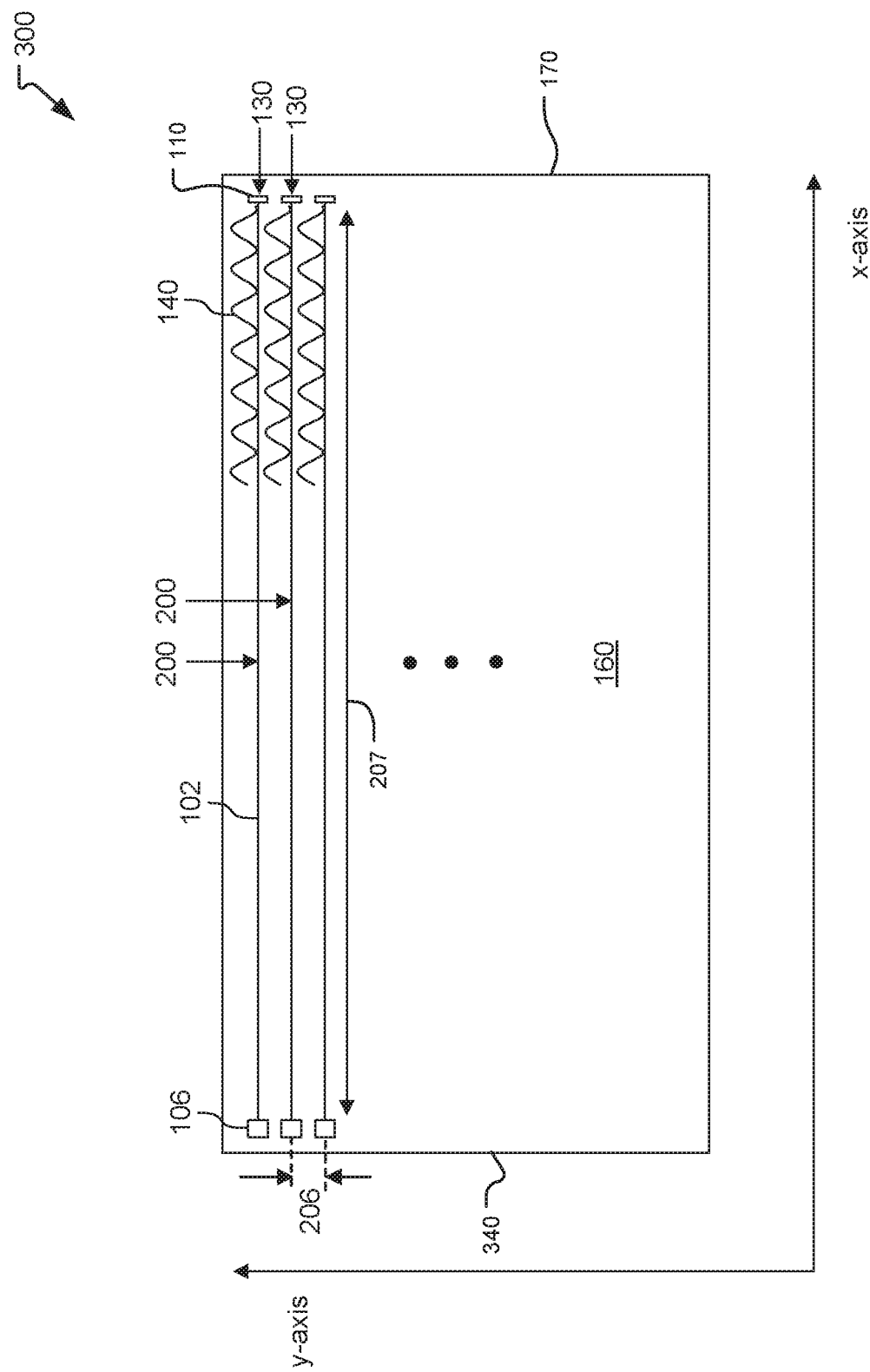
FIG. 8A shows a proximal face of a proposed light field generator device, where a partial array of SAW modulators within the light field generator device is also shown.
Figure 8B:
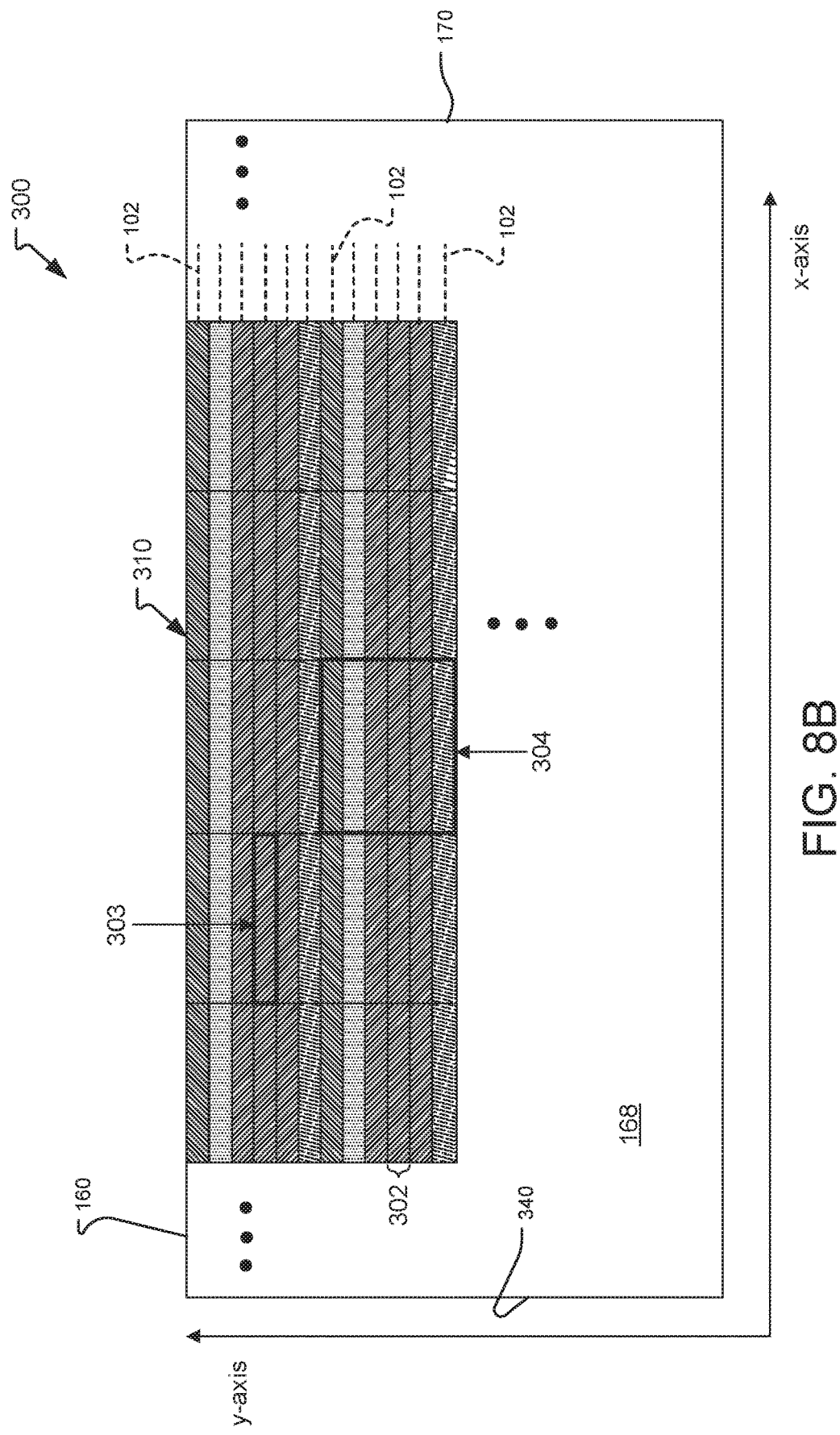
FIG. 8B shows a distal face of the light field generator device in FIG. 8A, which shows detail for a two dimensional array of output optics of the SAW modulators within the light field generator device.
Figure 8C:
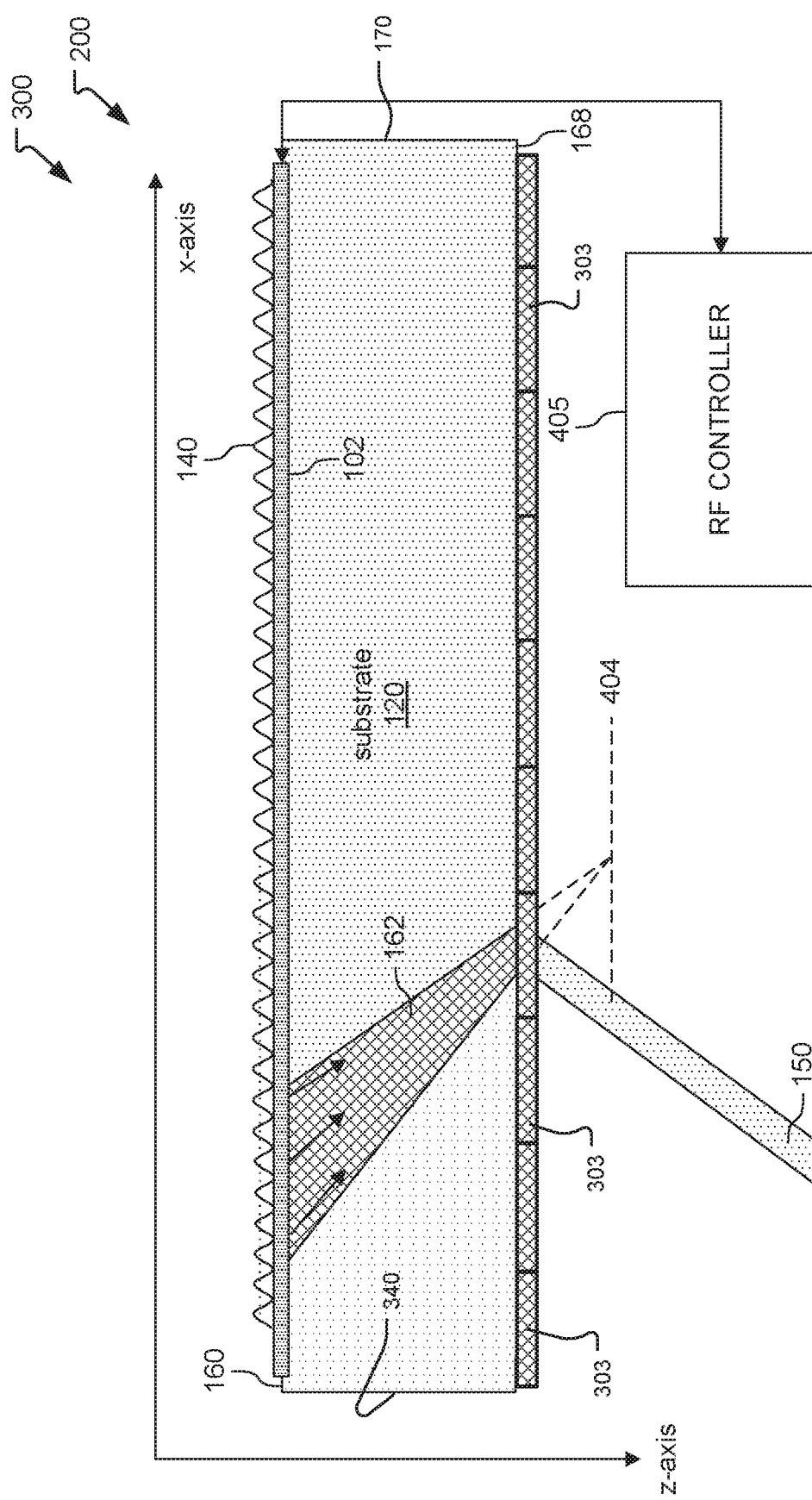
FIG. 8C is a schematic cross-section of a light field generator device as in FIG. 8A and 8B, showing a SAW modulator constructed with diverging diffractive lens output optics.

FIG. 8A shows a proximal face 160, FIG. 8B shows a distal/exit face 168, and FIG. 8C shows a side cross-sectional view (all not to scale) of an electro-holographic light field generator device 300 according to an embodiment of the present invention.

In general, the electro-holographic light field generator device 300 comprises an array of SAW devices or modulators 200. These SAW devices 200 are fabricated in a common substrate 120. As best shown in FIG. 8A, the longitudinal axes of each of these SAW devices 200 extend parallel to each other across the light field generator device 300 in the x-axis direction. Note: the axes x, y, z are used here to orient the geometry of the light field generator system and its components for clarity. This coordinate system has no relation to the x,y,z crystallographic axes of lithium niobate or any other material.

In more detail, and as described hereinabove, the substrate 120 may be made, for example, of lithium niobate following known processes such as that disclosed in Smalley. Many other materials and design choices are available including other piezoelectric materials and crystallographic orientations, and waveguide architectures such as planar, ridge, rib, embedded, immersed, and bulged. Doping such as MgO-doped lithium niobate may be useful, in some cases.

The array of surface acoustic wave (SAW) optical modulators 200 is arranged in the y-axis direction across the width of the common substrate 120. Each SAW optical modulator 200 includes an in-coupling device 106 (e.g., a laser in-coupling grating or prism), a waveguide 102 and a SAW transducer 110 (e.g., an IDT, for example).

As described before, the waveguides 102 provide confinement of the input light in a TE (transverse electric) guided mode 301, in one example. The SAW transducers 110 are driven by an RF input signal 130 that creates a corresponding surface acoustic wave 140 that propagates collinearly with the light 301 in the waveguide 102 and which interacts with the light to convert part of the light to the transverse magnetic (TM) polarization, leaky mode.

Birefringence of the waveguide 102 and the optical substrate 120 (and/or the wave-vector change from the interaction) causes the TM leaky mode portion of the light propagating in the waveguide 102 to leak out of the waveguide 102 into the optical substrate 120 as diffracted light 162 towards the exit face, which is the distal face 168, in this embodiment.

In different embodiments, the IDTs 110 can occupy a variety of specific locations and specific orientations with respect to the waveguide 102. For example, in the illustrated embodiment, the transducers 110 are located near the end face 170 so that the surface acoustic waves 140 will propagate in a direction opposite the propagation of the light in the waveguides 102. In other embodiments, however, the transducers 110 are located near the in-coupling devices 106 so that the surface acoustic waves 140 will co-propagate in the direction of the light in the waveguides 102.

Also, there could be multiple SAW transducers 110 for each in-coupling device 106/waveguide 102, with each SAW transducer 110 responsible for a different specific bandwidth around a given center frequency (e.g.: 100-150 MHz, 150-250 MHz, and 250-400 MHz).

In a specific embodiment, the array of SAW optical modulators 200 may be packed relatively tightly with a waveguide separation 206 of between 10 µm-400 µm, for example, 50 µm. The waveguide length 207 may be 1-10 centimeters (e.g., 5 cm) or even longer if multiple SAW transducers 110 and/or multiple laser inputs 106 are used to mitigate acoustic and optical attenuation respectively. In this context, a greater waveguide length 207 reduces system complexity and, if tiled into a larger display, it minimizes tile-borders ("grout"). Since the surface acoustic waves 140 move at the speed of sound, the light inputs 101 may be strobed at a repetition rate equal to or lower than the inverse acoustic transit time, at a pulse width sufficiently narrow (for example, in the range of nanoseconds to microseconds) to cause acceptably low blurring.

Each waveguide 102 may be configured for a single specific wavelength of input light 101, which in this context should be understood to include at least one of visible light, infrared light and ultraviolet light, or for multiple different light wavelengths. For example, for 3D display applications, each waveguide 102 may carry one or more of red, green, or blue light 101. In other specific light field generation applications, other wavelength combinations may be useful including more or fewer than three colors and/or non-visible wavelengths.

FIG. 8B shows the distal face 168 of a light field generator device 300, which is the exit face in the illustrated embodiment. According to the embodiment, the optical substrate 160 includes a two dimensional array 310 of output optics 303 for shaping output exit light 150. In illustrated example, the exit light 150 is collimated into a beam, focused at infinity.

The output optics 303 are diffractive lenses arranged into lens strips 302 (e.g., one strip for each waveguide). Each of the strips 302 is aligned under a respective waveguide 102. Each individual output optic 303 is the length of a display pixel (100 µm-2 mm, typically about 1 mm in the x-axis direction). Thus, with a waveguide pitch 206 of 50 µm each diffractive lens output optic 303 would be 1 mm×50 µm, and each diffractive lens strip 302 may be about 5 cm×50 µm.

The diffractive lens strips 302 may be chirped gratings with components that redirect light in both directions. That is, rectangular sections of a diffractive lens, which may or may not have different focal lengths in the horizontal and vertical directions, where "horizontal" means parallel to the length of the respective waveguide 102 (x-axis direction) and "vertical" means across the width of the respective waveguide 102 (y-axis direction).

Diffractive lens output optics 303 may be fabricated, for example and without limitation, by etching directly into/ onto the substrate 120, depositing metal dots or lines, or depositing dielectric dots or lines or pillars. Descriptions of exemplary generic algorithms and numerical grating optimization techniques may be found in:

Zhou et al., *Genetic local search algorithm for optimization design of diffractive optical elements*, Appl. Opt., vol. 38(20), pp. 4281-90 (1999);

Lin et al., *Optimization of random diffraction gratings in thin-film solar cells using genetic algorithms*, Solar Energy Materials and Solar Cells, vol. 92(12), pp. 1689-96 (2008);

Qing et al., *Crowding clustering genetic algorithm for multimodal function optimization*, Appl. Soft Computing, vol. 8(1), pp. 88-95 (2008);

Taillaert et al., *Compact efficient broadband grating coupler for silicon-on-insulator waveguides*, Opt. Lett., vol. 29(23), pp. 2749-51 (2004);

Shokooh-Saremi et al., *Particle swarm optimization and its application to the design of diffraction grating filters*, Opt. Lett., vol. 32(8), pp. 894-96 (2007); and Byrnes et al., *Designing large, high-efficiency, high-numerical-aperture, transmissive meta-lenses for visible light*, Opt. Exp. 24 (5), pp. 5110-5124 (2016).

The surface acoustic wave (SAW) optical modulators 200 on the proximal face 160 and the two dimensional array 310 of output optics 303 on the distal face 168 need to be carefully aligned in the width (y-axis) direction so that each waveguide 102 sends light into its corresponding diffractive lens strip 302. Their alignment in the longitudinal direction (x-axis) is less critical because it can be corrected for in the operating software during a calibration step in which a wafer thickness profile (including thickness non-uniformity) also can be measured and corrected.

FIG. 8C is a schematic cross-section of a light field generator device 300, showing a SAW modulator 200 constructed with diverging diffractive lens output optics 303.

An RF controller 405 includes at least one hardware implemented processor device that is controlled by software instructions to translate a desired 3D image into an appropriate RF waveform to control the respective SAW optical modulators 200 of the electro-holographic light field generator device 300. The objective is to develop the exit light 150 produced from all of the modulators 200 of the light field generator device 300 as a three-dimensional output light field. Software for driving electro-holographic displays of a variety of forms is described, for example, in Mark Lucente, *Computational holographic bandwidth compression,* IBM Systems Journal, 35(3 & 4), 349-365 (1996); Quinn et al., *Interactive holographic stereograms with accommodation cues,* Practical Holography XXIV: Materials and Applications, ed. Hans I. Bjelkhagen and Raymond K. Kostuk, SPIE (2010); and Jolly et al., *Computation of Fresnel holograms and diffraction-specific coherent panoramagrams for full-color holographic displays based on leaky-mode modulators,* Proc. SPIE Practical Holography XXIX, 9386, 93860A (Mar. 10, 2016).

The resulting three-dimensional output light field is similar to integral photography 3D displays in which there are known algorithms for deciding how much light to put into which views of which pixels. Such integral photography algorithms are usable in this context, or they can be modified for even better performance, for example, by adding in aspects of algorithms for electro-holographic display such as how to choose and adjust wavefront curvature (See, e.g., Smithwick et al., *Interactive holographic stereograms with accommodation cues,* Practical Holography XXIV: Materials and Applications, ed. Hans I. Bjelkhagen and Raymond K. Kostuk, SPIE (2010)). Another algorithm improvement is that the number of views that can be calculated and projected can be determined and updated in software to optimize the display quality rather than being fixed in hardware. In addition, the view direction can be continuously adjustable in one dimension.

Once the RF controller 405 determines how much light 101 needs to be put into a given view of a given pixel, the RF controller 405 then determines what waveforms of the RF drive signals 130 need to be applied to the transducers 110 of the respective SAW optical modulators 200 to produce that outcome. This involves determining the appropriate output optics 303 to use—each output optic 303 is able to send light of a particular wavelength into any of typically 10-100 different non-overlapping views.

Figure 9:
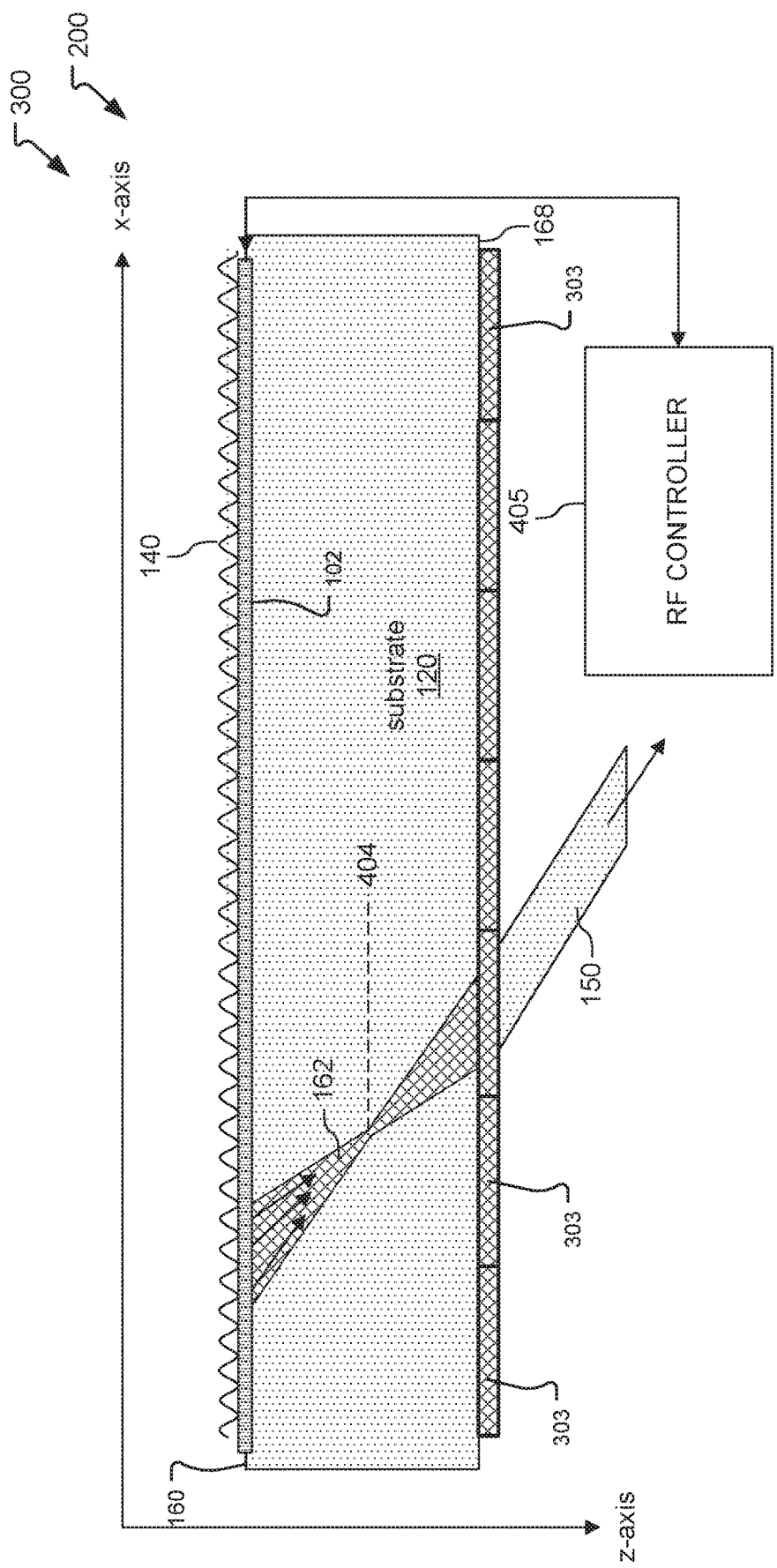
FIG. 9 is a schematic cross-section of a light field generator device as in FIG. 8A and 8B, showing a SAW modulator constructed with converging diffractive lens output optics.

Once the appropriate output optics 303 are determined, the RF controller 405 executes a computational back-propagation of that light through the output optics 303 and back into the corresponding waveguide 102. The computational interference between that back-propagated light and the waveguided light finally determines a specific waveform of the surface acoustic wave 140 to be used. In specific embodiments, the back-propagation can be pre-computed into a lookup table. For example, to create an approximately-collimated beam of exit light 150 (focused at infinity), a given specific chirped RF waveform creates a corresponding surface acoustic wave 140 in the waveguide 102, which creates out-coupled diffracted light 162 as shown in FIG. 8C. This diffracted light 162 approximately converges towards a certain point on the horizontal focal plane 404 of the diffractive lens output optic 303 (either in front of or behind the output optic 303 depending on whether the lens of the output optic 303 is diverging (as shown in FIG. 8C) or converging (as shown in FIG. 9 discussed below).

In the specific embodiment shown in FIG. 8C, each diffractive lens output optic 303 has the same length as an output pixel and spreads the radiated exit light 150 into a desirable field-of-view in the horizontal direction, for example, 90°. This information, together with the RF bandwidth and substrate index of refraction of the substrate 120 all are associated with a chirped spatial frequency profile of the diffractive lens output optic 303 and the diffractive lens strips 302 (which again acts as a slice of a diffractive lens in this specific embodiment).

It should be understood that in this context there is not some specific unique output optic 303 geometry that is optimal for a desired field-of-view. Rather there are multiple possible nominally acceptable designs with different characteristics such as different focal lengths, different lens centers, and/or specific optical aberrations. For example, some designs may be sharpest in the center of the field of view, while others are sharper towards the sides of the field-of-view but blurrier in the center. Selection of a specific profile for the output optics 303 is a matter of design choice.

Thus the RF controller 405 is configured to develop a hybrid three-dimensional output light field formed from the exit light 150 transmitted by SAW devices 200 of the light field generator devices 300. The output light field is holographic horizontally and spatially-multiplexed horizontally, vertically, or both to improve the angular range or resolution horizontally, vertically, or both, and also to incorporate the three colors. In the vertical direction, each diffractive lens output optic 303 can collimate (or approximately collimate as desired) the leaky mode diffracted portion of the waveguide light 162 coming out of the respective waveguide 102 and send it into a specific uniform vertical direction. With 50 μm-spaced (see reference 206) waveguides 102 and 1 mm×1 mm pixel size, then ~7 different vertical views may be produced, 7×3×50 μm ≈ 1 mm (where the 3 is to support red, green, and blue). The horizontal views can be continuously adjusted though there is a limit caused by the extent to which the radiation output 150 can be horizontally collimated; i.e. the blurriness of the horizontal view direction. The number of not-substantially-overlapping horizontal views may be in the 10-100 range, and depends on the RF bandwidth driving the SAW optical modulators 200.

A specific embodiment may utilize horizontal spatial multiplexing by putting two or more output optics 303 horizontally within each display pixel 304, in order to trade-off between the number of vertical views and horizontal views. The diffractive lens output optics 303 are optimized for maximum efficiency, so they should have antireflective properties.

Within each display pixel 304, the waveguides 102 can be arranged in a blocked order (e.g. RRRRGGGGBBBB) or in an interleaved configuration (e.g. RGBRGBRGBRGB). In blocked order, the diffractive lens output optics 303 may be configured such that vertically-neighboring output optics 303 merge into each other and are combined together into larger diffractive lens structures 304 (e.g., larger rectangular sections cut out of a single diffractive lens). This can help mitigate the issue when some light from a waveguide 102 travels vertically (in the y-axis direction in the Figures) and hits an unintended output optic 303. Interleaved order could also help with this same issue in a different way, if the diffractive lens output optics 303 respond in a narrow-band way and reject the light from an unintended neighboring waveguide 102. Blocked order may also make the optical layout (laser in-coupling configuration) simpler.

Depending on the specific application, the in-coupling device 106 can deliver the input light 101 into the waveguides 102 from either direction, in some cases simultaneously, but more often with interleaved strobes so that each optical direction obtains its own RF waveform. This could double the number of views per RF bandwidth. For example, we can have one laser direction send light into the left half of the field-of-view, and the other into the right half—one light input 106 would diffract off the +1 grating order and the other (co-located with SAW transducers 110) off the −1 grating order of the same diffractive lens output optic 303.

The waveguides 102 can carry red, green, and blue light either simultaneously or in interleaved strobes. The diffractive lens output optics 303 can be optimized for broadband and/or to impart phase independently for the three colors (e.g. Aieta et al., *Multiwavelength achromatic metasurfaces by dispersive phase compensation,* Science 347, 1342 (2015), which is incorporated herein by reference in its entirety).

FIG. 9 shows a side cross-sectional view of an alternate embodiment for one of the SAW modulators 200 of an electro-holographic light field generator 300 in which the diffractive lens output optics 303 are converging, rather than diverging as in FIG. 8C. In this embodiment, the leaky mode diffracted light 162 from the waveguides 102 is modulated by the surface acoustic waves 140 to converge at a focal plane 404 within the substrate 120 so that it is diverging as it enters an output optic 303. The output optic 303 then converges the radiated exit light 150 into a collimated beam (focused at infinity).

Figure 10:
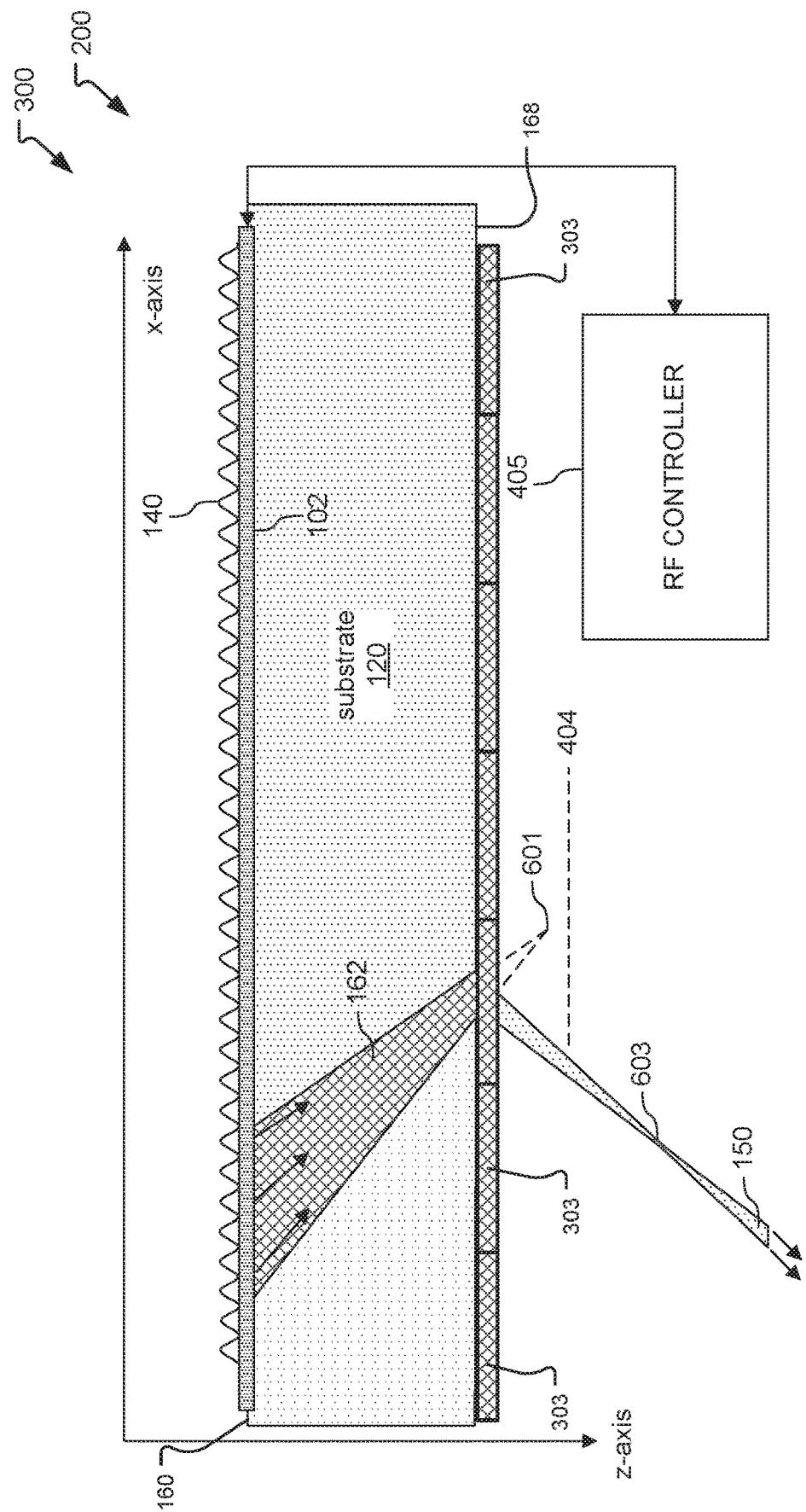
FIG. 10 is a schematic cross-section of a light field generator device as in FIG. 8A and 8B, showing a SAW modulator constructed with diffractive lens output optics.

FIG. 10 shows a side cross-sectional view of an alternate mode of operation for an electro-holographic light field generator 300. In this mode, the RF controller 405 operates the SAW optical modulators 200 so that the leaky mode diffracted light 162 passing through the output optics 303 converges towards a virtual focus 601 above the focal plane 404 of a lens output optic 303 by controlling the RF drive waveform. As a result, the radiated exit light 150 from each output optic 303 has a selected output focal point 603 beyond the focal plane 404 before the location of the observer. The surface acoustic wave 140 can be controlled to locate the output focal point 603 at any desired specific distance (within reasonable limits).

In some embodiments, the output optics 303 may be reflective rather than transmissive, e.g. as a curved mirror or as a reflective diffractive lens. This could entail some modification of the grating period profile and/or an antireflective coating on the surface of the wafer through which the light enters the air. This surface may be the waveguide surface, or may be an edge.

The diffractive lens periodicity profile may not specifically be a section of a conventional diffractive lens, but may be modified—for example, including some positive or negative spherical aberration—in order to optimize the distribution, blurriness, wavefront curvature (focus), and other properties of the views. For the same reason, the RF encoding may be more complicated than described in the embodiments described above, and more specifically may be modified from the back-propagation algorithm results, for example by apodization of the RF waveform in the time or frequency domain. The diffractive lens output optics may have a helical property such that horizontal position determines vertical deflection, instead of (or in addition to) horizontal deflection. In such a case, the display may usefully be oriented with vertical rather than horizontal diffractive lenses.

Figure 11A:
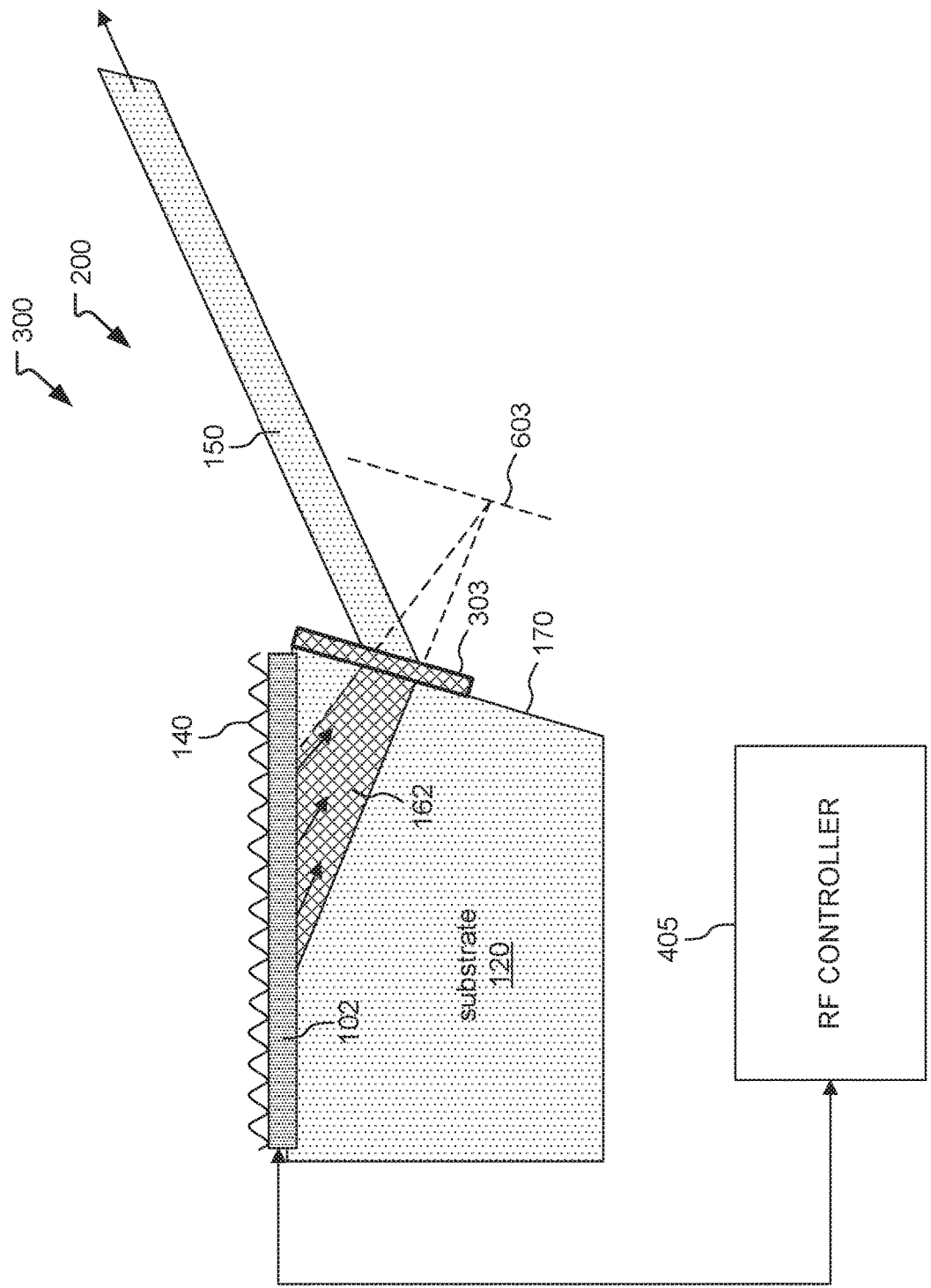
FIG. 11A is a schematic cross-section of a light field generator device as in FIG. 8A and 8B, where a SAW modulator having a single output optic at an end face of the SAW modulator functions as an exit face of the light field generator device.

FIG. 11A shows a side cross-sectional view of another electro-holographic light field generator 300. A SAW device 200 within the light field generator 200 is shown, in which the end face 170 functions as the exit face. Thus, the exit face need not necessarily be the distal face 168. A single output optic 303 is at the distal face 168. In this example, the RF controller 405 operates the SAW optical modulators 200 so that the leaky mode portion of the diffracted light 162 converges towards a focal point 603 beyond the side exit surface/end face 170, which is deflected by the output optic 303 as a side radiated exit light 150. The output optic is a refractive lens or diffractive lens/grating in different examples.

By using a variety of different focal depths per pixel, a display constructed from the light field generators 200 can be improved in several metrics including image quality and depth, vergence-accommodation conflict, and astigmatism. In the horizontal (x-axis) direction, the operating software can accomplish that by using an RF encoding to the SAW optical modulators 200 that sends light towards a point in front of or behind the diffractive lens focal plane. In the vertical (y-axis) direction, the diffractive lens output optics 303 can have different focal lengths in different areas of the substrate 120. The feature of continuously-adjustable view direction (as opposed to discrete views) can be helpful for display quality, particularly alleviating some aliasing issues common with other 3D displays (e.g. Zwicker et al., *Antialiasing for Automultiscopic* 3D Displays, Eurographics Symposium on Rendering, 2006). This is somewhat related to ability to manipulate wavefront curvature as described above, which similarly helps improve display quality.

The approaches described above enable a higher display quality due to the small effective (sub) pixel size, lack of horizontal aliasing, and ability to continuously adjust the horizontal wavefront curvature. The conventional acousto-optic-modulator-based holographic 3D display (e.g. "MIT Mark 1", 2, or 3) is horizontal-parallax-only (HPO) made with an acousto-optic or SAW modulator in a descanning configuration (e.g. with a spinning polygon). But such descanning is very challenging at best in a thin display with no-moving-parts. Descanning can be avoided using strobe lights (e.g. Jolly et al., *Near-to-eye electroholography via guided-wave acousto-optics for augmented reality,* Proc. of SPIE Vol. 10127, 2017), but the thin form factor also prevents overall demagnification and hence leads to a very limited angle exit fan.

There are some known ways to increase the angle fan in an electro-holographic display without pixelating the holo-line as described above, but no one has previously suggested breaking the holo-line into pixels and using lenses to increase the angle spread of each pixel. Of course, this is not a conventional holographic technique, but is more like a hybrid with integral photography. Cutting up the hologram as described above does reduce the image quality compared to a full proper hologram, but degradation is likely to be acceptable in many practical applications and certainly can be better than non-holographic alternatives.

The combined configuration of the lens focal plane 404, waveguide 102, and RF encoding such as that shown in FIG. 8C is particularly beneficial over known conventional approaches to encoding the discrete data (which views of which pixels should be turned on in each video display frame) into an RF waveform such as encoding the data-points in different time-slots or in different frequency-slots in the waveform. Rather, each data point contributes a specific chirped waveform spread out in both time and frequency, which greatly increases flexibility as to the location and orientation of the diffractive lens array. That allows the use of a flat pattern on the back side of a wafer-shaped optical substrate, which can be very convenient in practice.

In some embodiments, it may be useful to have a second layer of diffractive lenses or other optical components, for example, to deal with diffraction effects. In addition or alternatively, the transmissive diffractive lenses can be replaced or supplemented by refractive or reflective optics; e.g., either cut out of the optical substrate 102 or attached to the optical substrate. Some embodiments may also omit the vertical parallax response, instead making a horizontal-parallax-only (HPO) display. Such a display may be simpler to implement with fewer waveguides, which can be larger and spaced farther apart, which in turn may make the system easier to build for various reasons, including reducing the number of RF and optical connections, switches, and drivers.

Figure 11B:
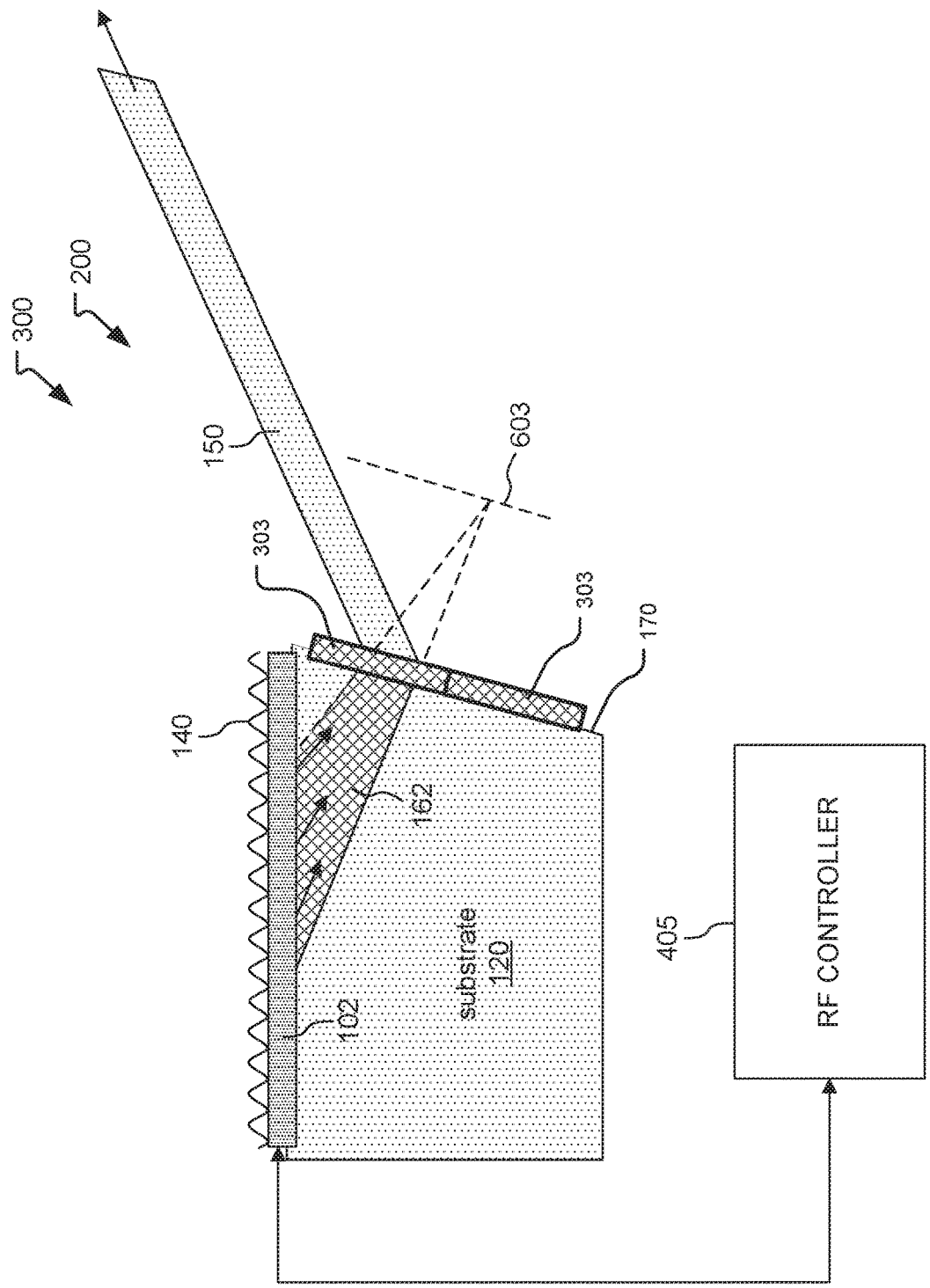
FIG. 11B is a schematic cross-section of a light field generator with two output optics at the end face.

FIG. 11B is another implementation of the electro-holographic light field generator 300 in FIG. 11B. Here, two output optics 303 provided on end face 170.

In some embodiments, it may be useful to maximize thinning of the optical substrate 120 to reduce the distance between the waveguide layer and diffractive lens output layer. In some instances, this gap may need to be so thin that these two components cannot be on two opposite sides of a single self-supporting wafer.

Figure 12:
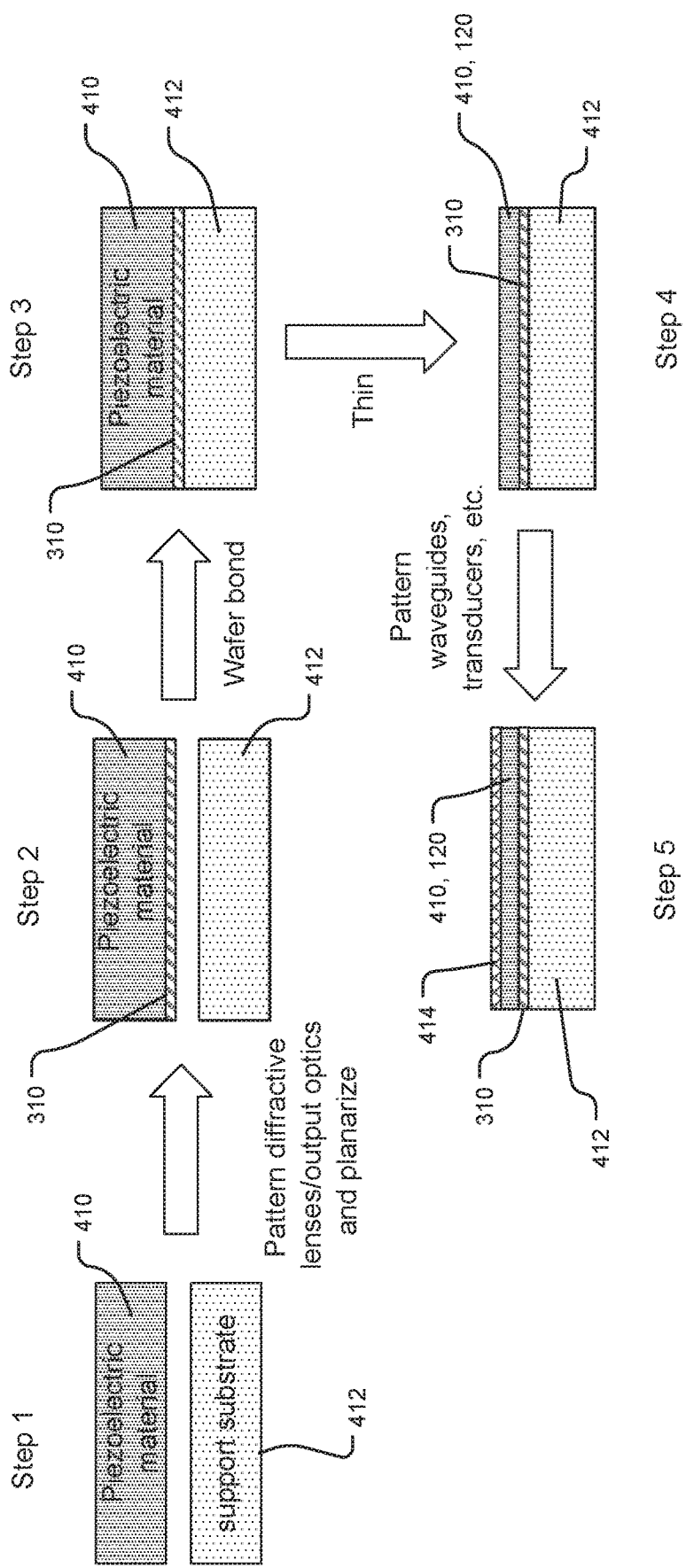
FIG. 12 illustrates a process for creating a SAW device that minimizes separation between waveguide and the distal/exit face.

FIG. 12 illustrates one possible process of creating a substrate 120 that minimizes component separation.

In step 1, a piezoelectric material wafer 410 and a support substrate (e.g. glass) are selected. In one example, the piezoelectric material is lithium niobate.

In step 2, the piezoelectric material is planarized and then patterned with output optics such as a two dimensional array 310 of output optics 303 and described previously.

The piezoelectric material wafer 410 is then bonded to the separate support substrate or wafer 412 using a wafer bonding process in step 3. This encapsulates the output optic array 310 between the two wafers or substrates.

Then, the piezoelectric material wafer 410 is mechanically thinned down in step 4 to produce final thickness for the device substrate 120. This can be performed using CMP, for example. CMP is chemical mechanical polishing/planarization, which thins and smooths the surface of the wafer using a combination of chemical and mechanical forces.

According to step 5, topside components 414, such as waveguides 102, incoupling devices 106, and IDTs 110, are patterned within/upon the surface of the now-thinned piezoelectric material 410 which will function as substrate 120. If a second layer of diffractive lenses or micro-lenses is needed, it can be provided on the back of the piezoelectric material 410 as layer 414, or the back of the substrate could be made reflective, enabling two passes through the output optics. As with other surfaces, the back of the substrate could also have an anti-reflective coating.

Figure 13A:
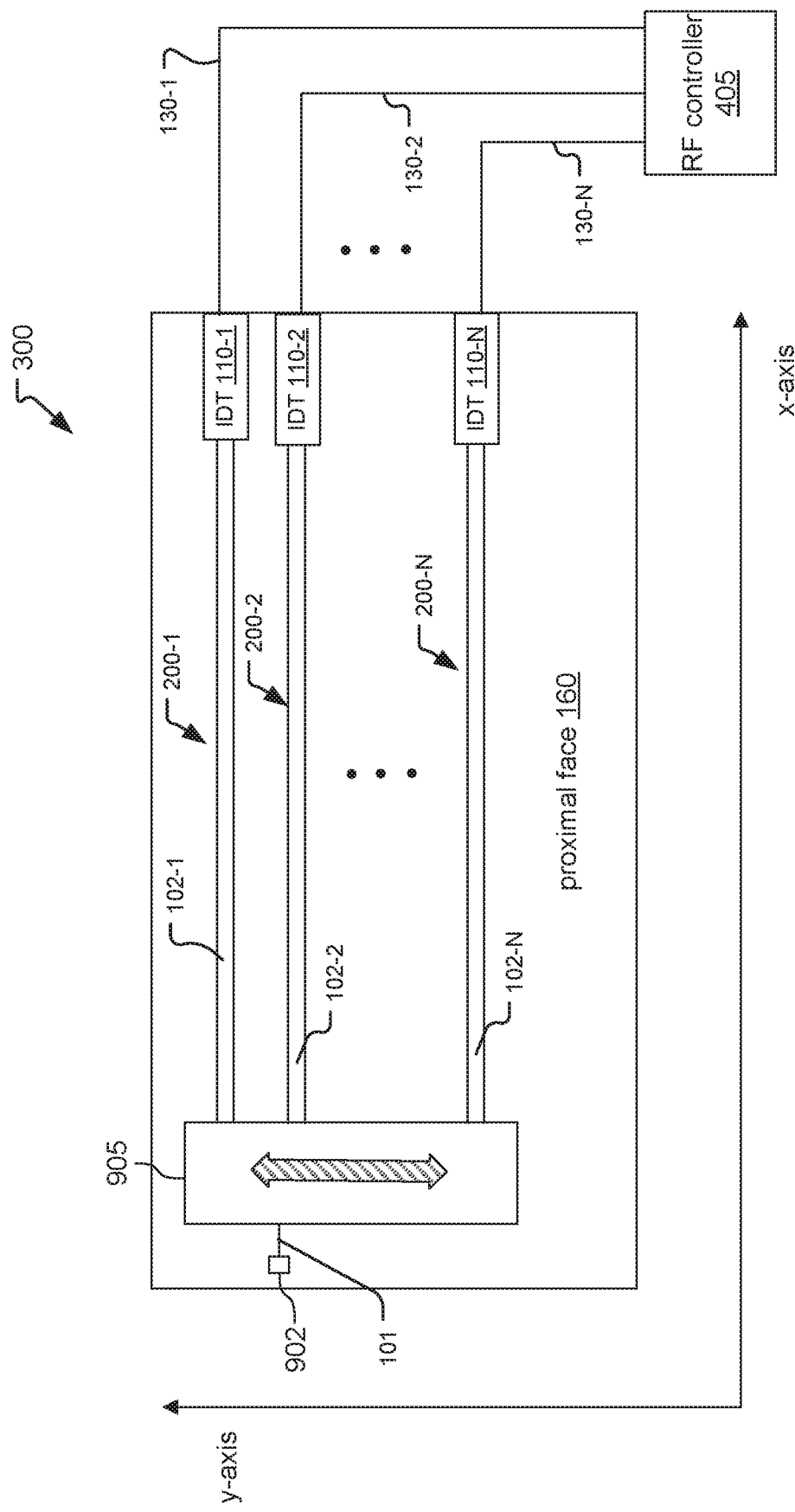
FIGS. 13A and 13B are diagrams that illustrate time multiplexing of light and/or RF signal inputs to a light field generator device including one or more SAW devices and optical splitter of light to the SAW devices from one source.

FIG. 13A illustrates time-multiplexing of input light 101 and/or RF input signals 130 applied to a light field generator device 300. The light field generator device 300 includes an array of SAW devices 200.

One challenge of SAW-based electro-holographic displays is the large number of illumination in-coupling ports 106 and RF drive lines 130. The present embodiment addresses the issue of coupling light into each of the waveguides 102 by relying on time-multiplexing.

As before, the proximal face 160 includes an array of waveguides 102. These multiple waveguides 102 are fed with an optical signal input light source 902 using beam displacer 905. The input light source 902 provides one or more wavelengths of input light 101, such as red, green and blue. In one example, the input light source 902 is a laser or system of lasers.

The beam displacer 905 operates via any of several techniques for steering or displacing the laser beam of input light 101 into the waveguides 102-1 to 102-N (e.g., liquid crystal steering (as in S R Davis et al., *Analog, non-mechanical beam-steerer with 90 degree field of regard*, Proc. of SPIE Vol. 6971, 69710G, (2008)), SAW-based steering (as in C S Tsai et al., *Guided-Wave Two-Dimensional Acousto-Optic Scanner Using Proton-Exchanged Lithium Niobate Waveguide*, Fiber and Integrated Optics 17, 157 (1998)), wavelength tuning accompanied by a pair of diffraction gratings, and so on. In other variations, a surface acoustic wave beam may be displaced instead of the laser beam of input light 101, or the beam of input light 101 may be steered instead of (or in addition to) displacing it, and so on.

At the other end, a series of IDT's 110 generate the SAWs the propagate along waveguides 102. RF controller 405 generates RF input signals 130-1 . . . 130-N for each of the IDTs 110-1 . . . 110-N.

In specific embodiments, all of the waveguides 102 may be strobed simultaneously or in a sequence. Additionally, the waveguides 102 can be included in different groupings. In this way, the waveguides 102 within each group might be strobed simultaneously, and the different groups strobed sequentially, in another example.

Alternatively, if the strobe lights illuminate different waveguides in sequence rather than simultaneously, a single large SAW transducer 110 can produced the SAW's for multiple waveguides, or many SAW transducers 110 may be coupled to a single RF input signal 130 feed.

Figure 13B:
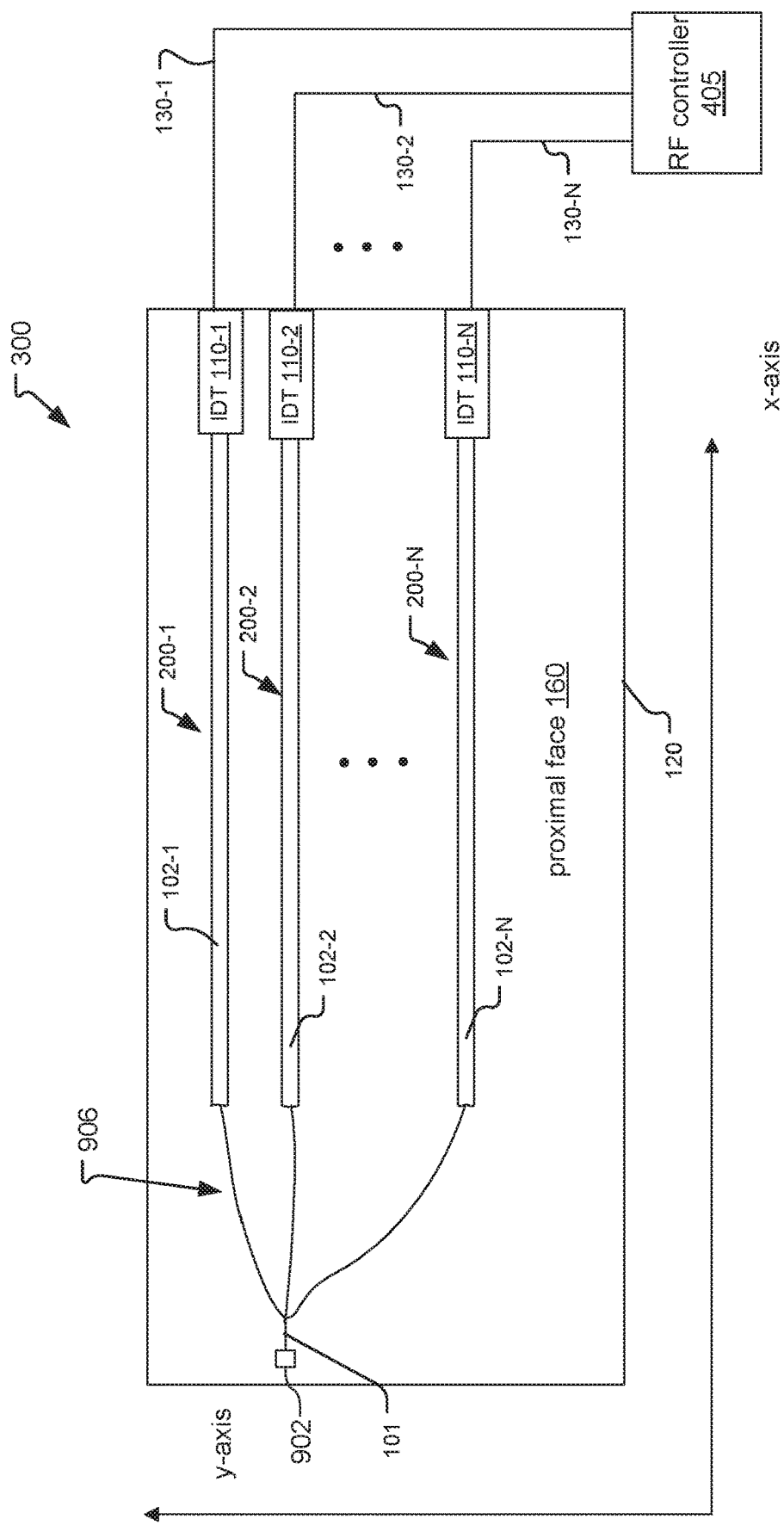

FIG. 13B illustrates a different embodiment. The beam displacer or beam switch 905 is replaced with a beam splitter 906. It divides the input light 101 from input light source 902 equally into the waveguides 102-1 to 102-N. This allows one light source to drive multiple SAW devices 200. In one embodiment, the splitter is formed by waveguide formed in or on the SAW substrate 120.

It also may be helpful to account for speed-of-sound frequency dispersion, for acoustic attenuation with distance, and for optical attenuation with distance (due partly to SAW scattering) when encoding the waveform of the RF light signals 130. This may be done with higher accuracy by calibrating each unit separately, controlling the unit's temperature and/or measuring the unit's temperature to adjust the corrections.

In the specific application of a 3D display system 920, there may be two additional optical polarizers—one optical polarizer between the light input element and the SAW optical modulator 200, and the other optical polarizer at the exit face. It is noted that in this context, leaky mode SAW optical modulators have the property of placing the exit light 150 in a polarization state that is rotated with respect to the relatively high level of background noise that is present from non-modulated light reflecting within the modulator.

Figure 14:
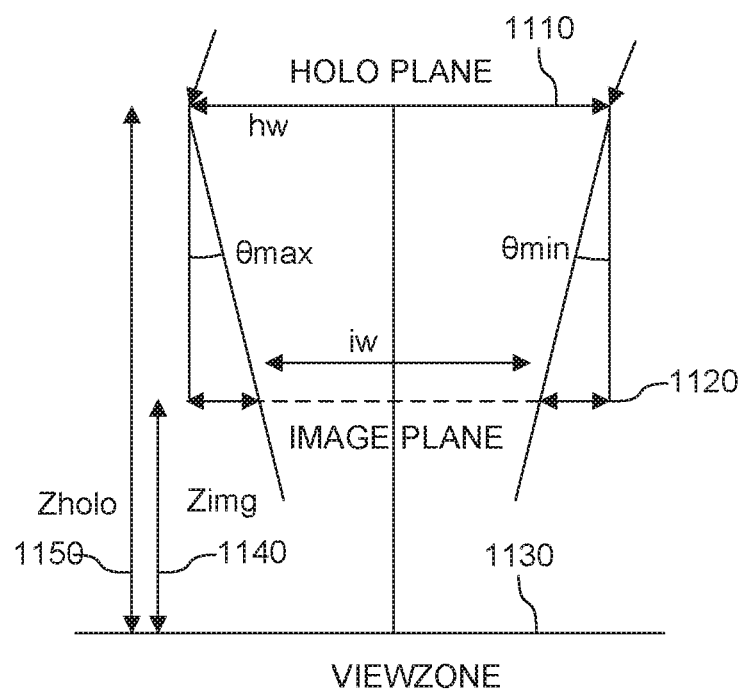
FIG. 14 is a schematic section taken through planes of a prior art holographic display system.

U.S. Pat. No. 6,927,886, to Plesniak et al., incorporated herein by reference, hereinafter known as Plesniak, describes software to manipulate the viewability of a holographic image. FIG. 14 is also FIG. 11A in Plesniak.

In FIG. 14, relationships between a modulator plane 1110, a spatially distinct image plane 1120, and a viewzone 1130 are shown. The image depth 1140 and the hologram depth 1150 are also shown. Using embodiments of the proposed system, optical power can be added by virtue of hardware embodiments not just for the expansion (or contraction) of the output's angular subtense, but to effectively "throw" the vertex of the output fan towards or behind the modulator plane 1110 itself. This has benefit in fields such as holographic display, in which the perceived resolution drops with distance from the display. The image as viewed from the view zone is formed in the image plane 1120. By adding or subtracting optical power, a surface of best resolution can be created at surfaces other than the modulator's exit face(s). Operation in this context is described, for example, in Plesniak et al., "Reconfigurable image projection holograms," Opt. Eng., vol. 45(11), (2006). In an arrangement of this sort, diffraction gratings, or the additional refractive or reflective optical element(s), can be "tuned" during manufacture or computationally to best match the features of the reconstructed holographic imagery, when the SAW device is used as a component of an electronic display.

In accordance with embodiments of the present invention, an optical engine of electro-holographic displays may be provided, such as: a desktop 3-D computer display, a head-worn near-eye virtual reality/augmented reality/mixed reality display, a virtual sand table, or the walls of a room creating immersive imagery. Applications of such displays include: battlefield visualization, interventional medical imaging for procedure planning and guidance, molecular visualization, and entertainment.

Electro-Holographic Display Architecture

Figure 15:
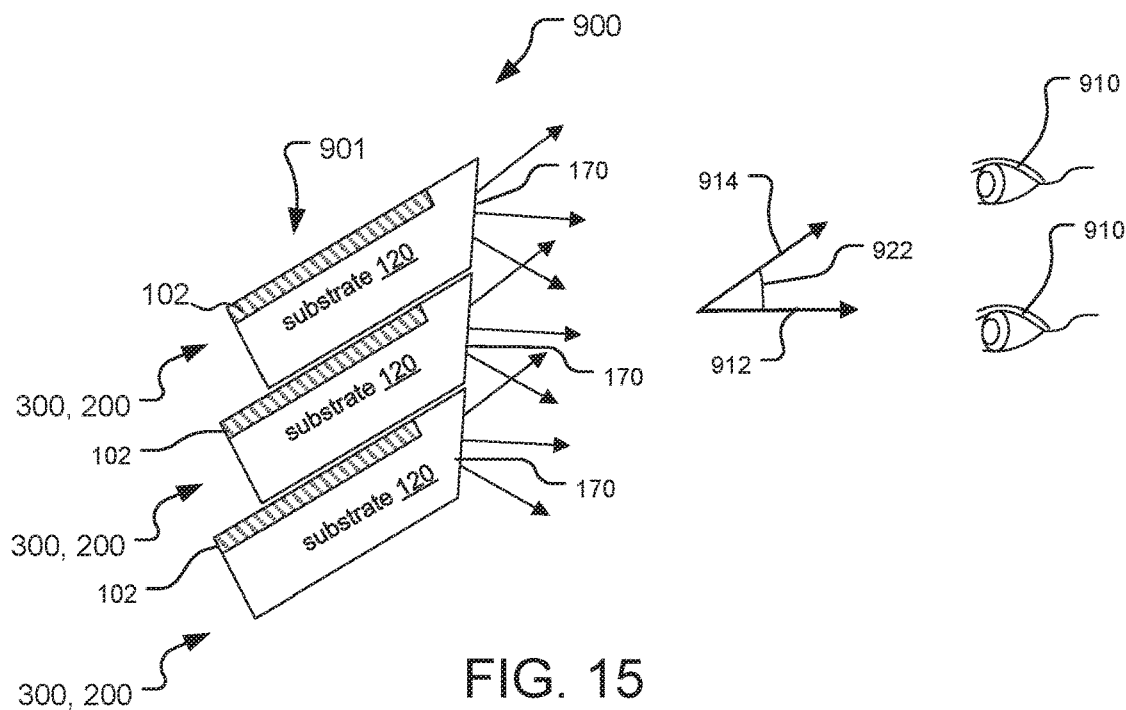
FIG. 15 shows an electro-holographic 3D display formed from a stack of light field generator devices, where the light field generator devices include SAW devices having angled end faces.

FIG. 15 shows multiple electro-holographic light field generator devices 300 stacked to form an electro-holographic 3D display 900, according to one embodiment.

In more detail, edge-fire SAW optical modulators 200 are employed in the electro-holographic light field generator devices 300. In an edge-fire SAW device 200, the exit light 150 is emitted out the end face 170 of each optical modulator 200 of the stacked light field generator devices 300. Further, these SAW optical modulators 200 preferably utilize non-orthogonal end faces 170.

The light field generator devices 300 have longitudinal axes, defined by the direction of the waveguide 102 of the SAW modulator devices 200 that form the light field generator devices 300. These axes are parallel to line 914. Further, the light field generator devices 300 are arranged in a stack 901 such that the direction of their longitudinal axes 914 is at an angle 922 to the direction 912 of observers 910. Typically, the angle 922 is between 20 and 70 degrees.

Moreover, the light field generator devices 300 are arranged, one on top of the other, such that the distal faces 168 of the modulator devices 200 of one light field generator device 300 are adjacent to the proximal face 160 of the modulator devices 200 of the next light field generator device 300. Moreover, the end faces 170 of the separate SAW devices 200, generator devices 300 all lie in approximately the same vertically extending plane.

Figure 16A:
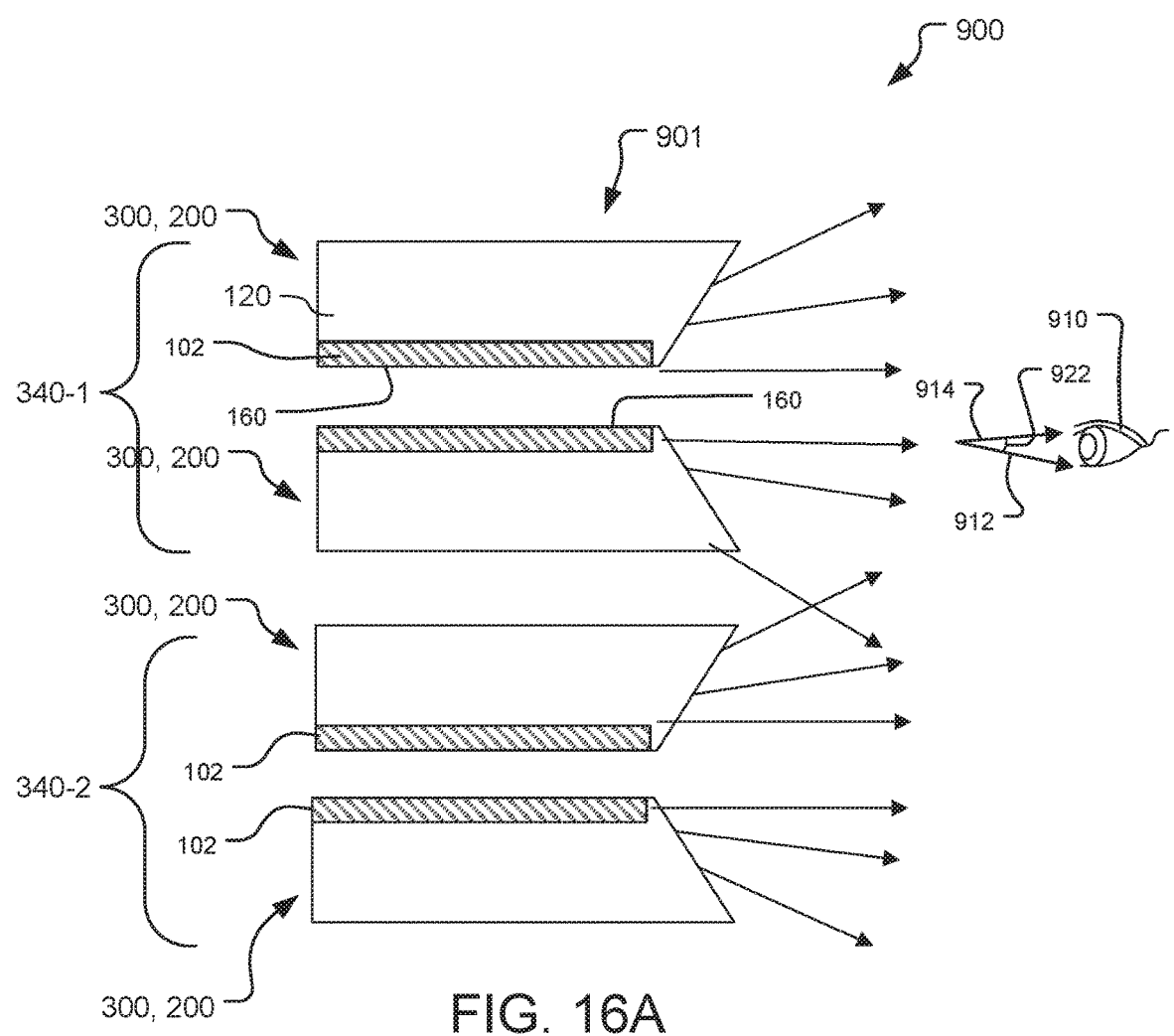
FIGS. 16A and 16B show electro-holographic 3D having different stacking arrangements of light field generator devices than in FIG. 15.

FIG. 16A shows electro-holographic light field generator devices 300 stacked to form an electro-holographic 3D display 900, according to another embodiment.

This embodiment also employs edge-fire SAW optical modulators 200 in the electro-holographic light field generator devices 300. And, these optical modulators 200 preferably utilize non-orthogonal end faces 170 in which the edge cut angles are acute. In this example, however, the longitudinal axis 914 of each of the modulator devices 200 is pointed at the observers 910, such that angle 922 is less than 15 degrees, and possibly 0 degrees.

Moreover, the light field generator devices 300 are arranged in a stack 901, in pairs 340. Two pairs 340-1 and 340-2 within the stack 901 of light field generator devices 300 are shown.

In each pair 340, the proximal faces 160 of the modulator devices 200/light field generator devices 300 are adjacent to each other. The pairs 340 are then stacked such that the distal faces 168 of the modulator devices 200 of one pair 340-1 are adjacent to the distal faces 168 of the modulator devices 200 of the next pair 340-1 in the stack 901.

Figure 16B:
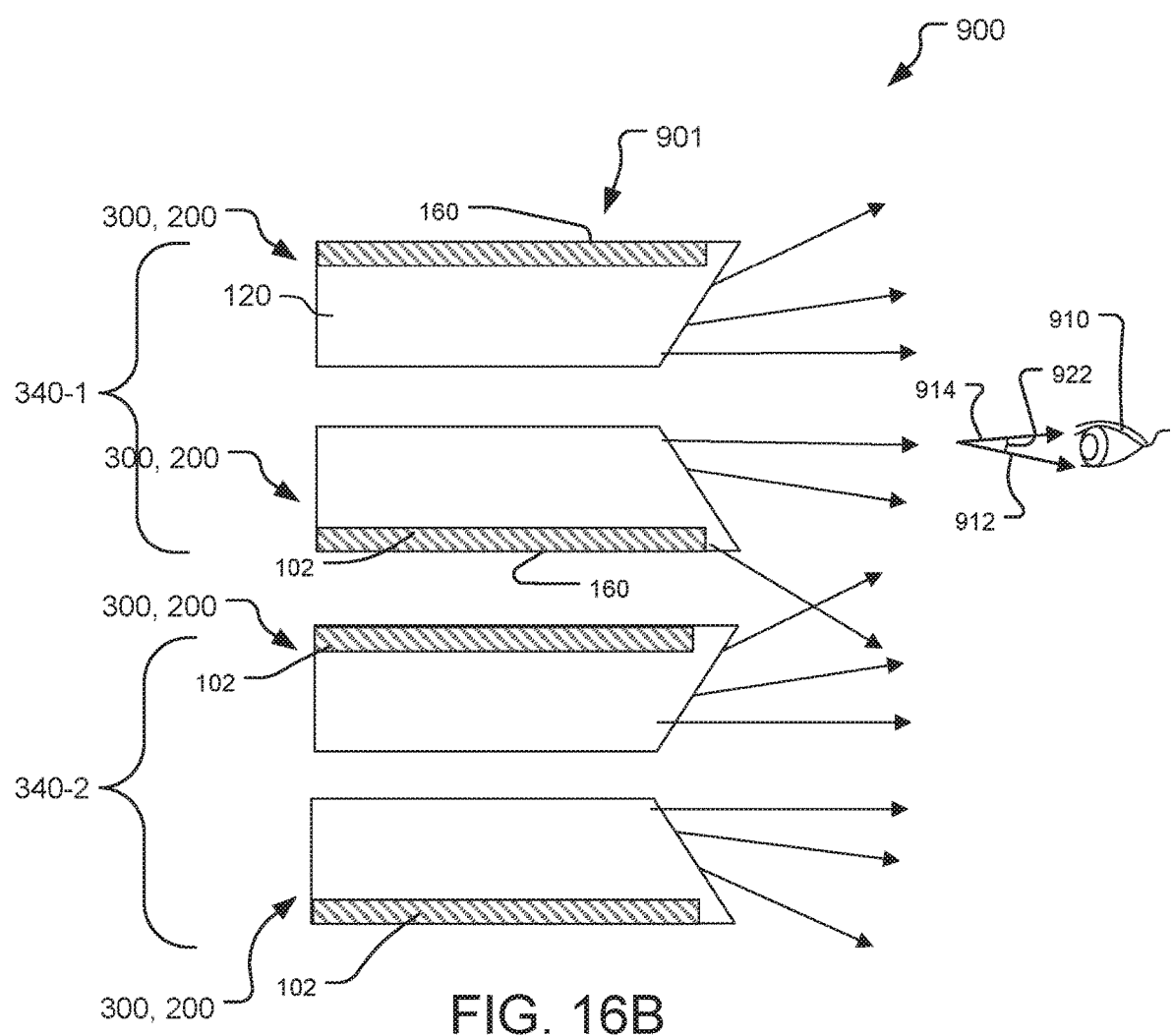

FIG. 16B also shows electro-holographic light field generator devices 300 stacked to form an electro-holographic 3D display 900, according to another embodiment.

This embodiment also employs edge-fire SAW optical modulators 200 in the electro-holographic light field generator devices 300. And, these optical modulators 200 preferably utilize non-orthogonal end faces 170, but here the edge cut angles are obtuse.

Figure 17:
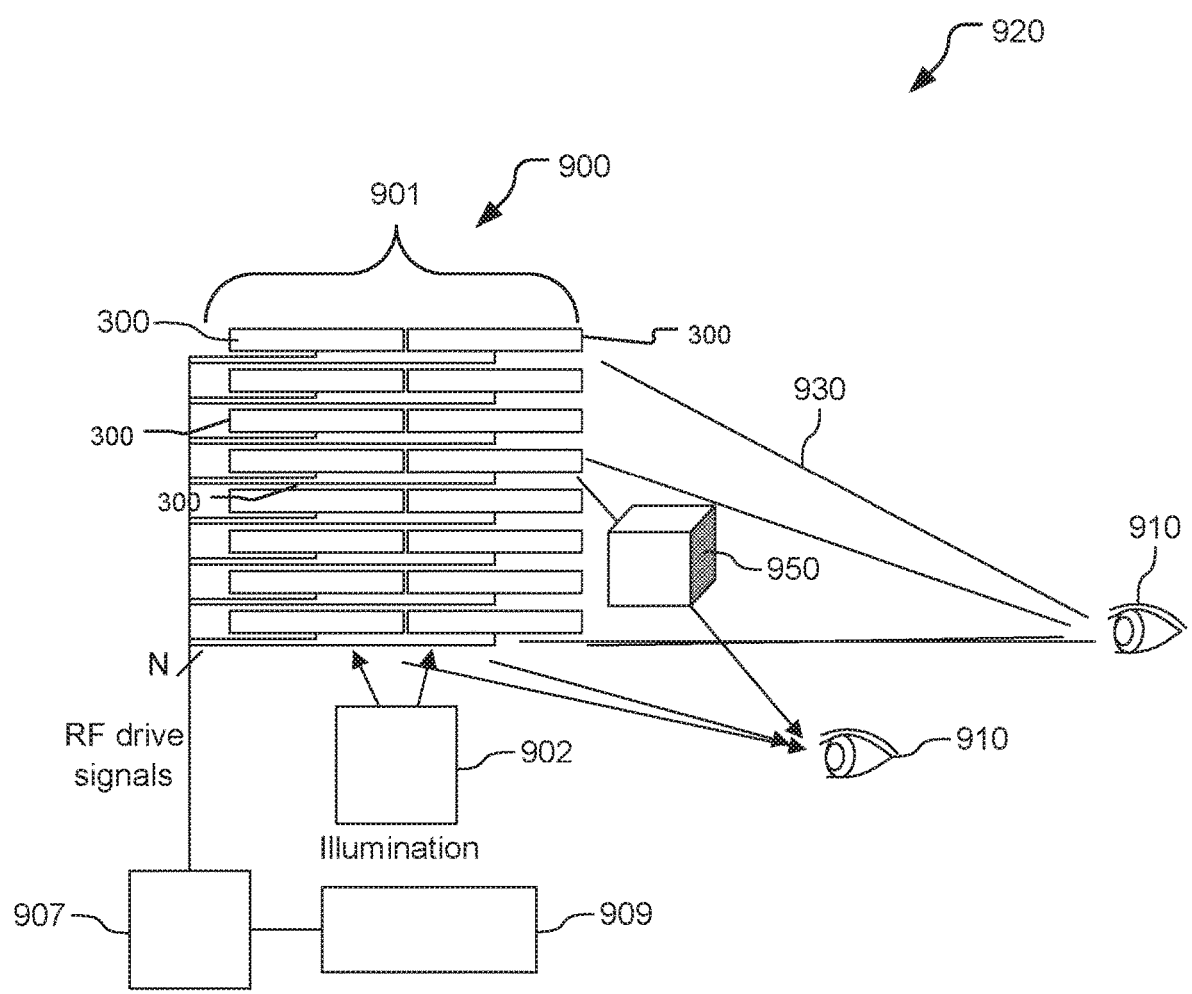
FIG. 17 shows a 3D display system that includes an electro-holographic 3D display and other components for powering and controlling the electro-holographic 3D display, where the display is formed from a dual-column stack of light field generator devices.

FIG. 17 shows a 3D display system 920. The 3D display system 920 includes an electro-holographic 3D display 900 and also includes additional components. The additional components include an illumination source 902, an RF driver 907, and a processor 909. Here, the electro-holographic light field generator devices 300 of the electro-holographic 3D display 900 are arranged in a dual column stack 901. The light field generator devices 300 are stacked and arranged side by side to obtain a 3D display system 920 with a wider display field in the lateral direction.

Each of the electro-holographic light field generator devices 300 within the electro-holographic 3D display 900 receives a beam of input light 101 generated by illumination source 902. The illumination source 902 might be a laser such as a pulsed laser, to cite one of many possible examples of illumination light sources 902. The laser might illuminate the generator devices 300 together in a beam. Separate in-coupling prisms could be used to couple light into each of the separate waveguides.

The light field generator devices 300 are driven by the RF driver 907 (also referred to herein as a "controller"). The RF driver 907 is governed by processor 909 on the basis of typically digitized graphical data resident or derived in a format appropriate for the electro-optical subsystem of the light field display 900. The 3D display system 920 produces a modulated exit beam 930, in accordance with any of the teachings provided herein above, such that observers 910 in the far field perceive an object 950 to be projected in three dimensions.

It is to be understood that the teachings presented herein may be applied to SAW device 200 configurations described herein but may also be applied to any other SAW device 200 configurations, whether currently known or developed in the future.

It is also important to note that such light field generators 900, though described in the specific context of 3D display systems, also can usefully be applied to other applications such as optogenetics, 3D printing, cloaking, and near-eye displays for augmented reality/virtual reality (AR/VR).

Embodiments of the invention may be implemented in part in any conventional computer programming language such as VHDL, SystemC, Verilog, ASM, Python, C, C++, MATLAB etc. Alternative embodiments of the invention may be implemented as pre-programmed hardware elements such as, without limitation, combinations of one or more of a field-programmable gate array (FPGA), graphics processing unit (GPU), central processing unit (CPU) and other related components, or as a combination of hardware and software components.

Embodiments can be implemented in part as a computer program product for use with a computer system. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., microwave, infrared or other transmission techniques). The series of computer instructions embodies all or part of the functionality previously described herein with respect to the system. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software (e.g., a computer program product).

IDT Architecture

Figure 18E:
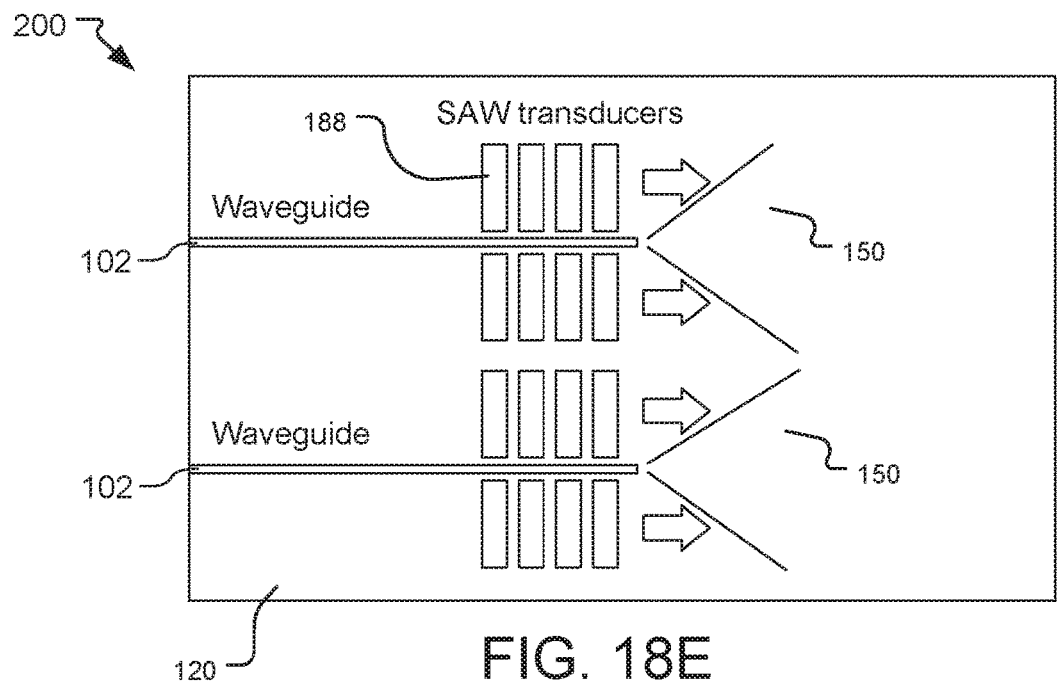

FIG. 18A shows detail for a prior art IDT 110.

In the 'slab' configuration which waveguide 102 assumes in FIG. 1A, the IDT 110 is comprised of transducer fingers 188. These transducer fingers 188 are typically patterned at a higher layer than the waveguide 102, rather than at the same layer as the waveguide. As a result, sound waves (e.g. the surface acoustic waves 140) propagate at a lower "altitude" than the IDTs. Embodiments of the SAW devices 200 disclosed herein might utilize an IDT 110 having transducer fingers 188 in accordance with FIG. 18A.

FIG. 18B through FIG. 18G show different layouts of transducer fingers 188 that can be constructed for the various embodiments of the SAW devices 200 proposed herein.

FIG. 18B, for example, shows transducer fingers 188 of a waveguide that uses the geometry of a channel rather than that of the 'slab' configuration of the waveguide shown in FIG. 1A. The transducer fingers 188 are disposed astride the channel waveguide 102. Longitudinal acoustic wave 189 is shown propagating in the channel waveguide 102. The channel waveguide 102 may support multiple modes of electromagnetic radiation. Here, the configuration of the transducer fingers 188 may advantageously provide enhanced electro-mechanical efficiency when compared with the prior art slab configuration of FIG. 18A.

FIG. 18C shows a view similar to that of FIG. 18B, additionally depicting an emergent fan of deflected exit light 150. FIG. 18D shows a side view of the transducer fingers 188 in FIGS. 18B and 18C, and also shows diffracted light 162 inside substrate 120 which emerge as rays of exit light 150 outside the substrate 120.

Figure 18F:
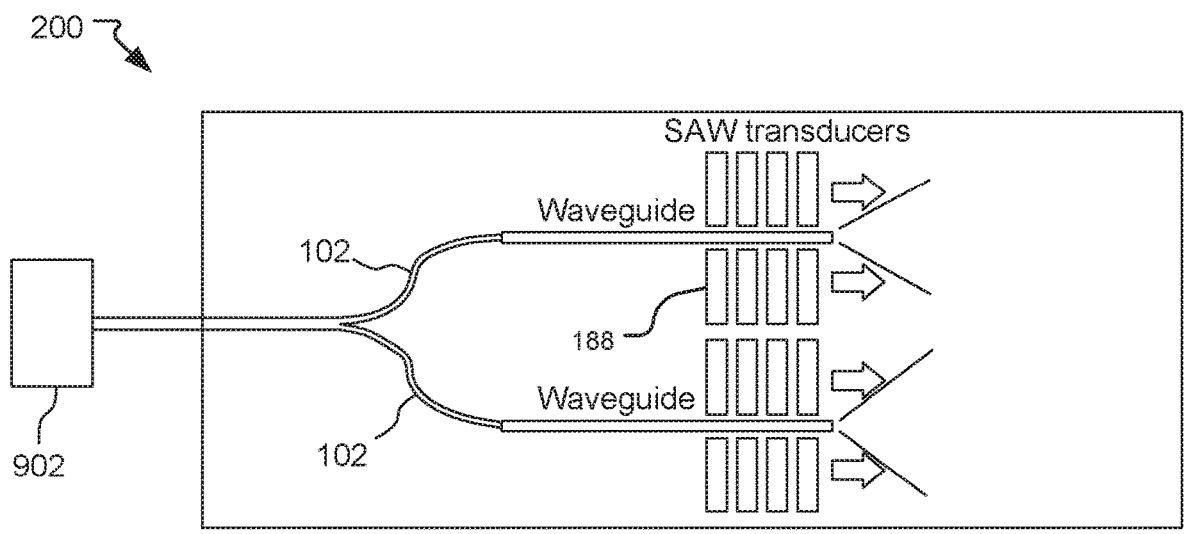
Figure 18G:
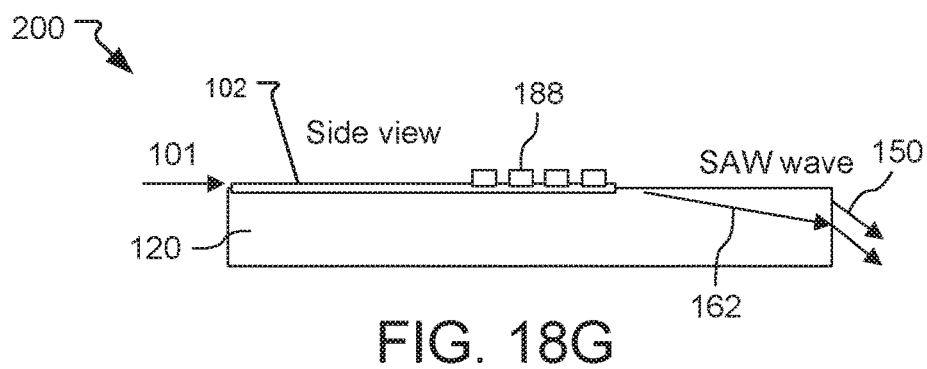

In the embodiment shown in FIG. 18F, multiple waveguides 102 may be patterned into the material used for SAW device 200, such as lithium niobate, for example. Light used to illuminate multiple waveguides 102 as shown in FIG. 18F may also be derived from a single input light source 902. FIG. 18G is a cross-sectional side view of either of the embodiments of FIG. 18E or 18F.

While this invention has been particularly shown and described with references to preferred embodiments thereof, it will be understood by those skilled in the art that various changes in form and details may be made therein without departing from the scope of the invention encompassed by the appended claims.

What is claimed is:

1. A surface acoustic wave optical modulator, comprising:
   a substrate having an exit face;
   a transducer for generating a surface acoustic wave in the substrate;
   an incoupling device for coupling light into the substrate;
   an optical waveguide in the substrate for guiding the light from the incoupling device through the substrate until the light is diffracted from the optical waveguide by being polarization-rotated out of a guided mode of the optical waveguide and into a leaky mode of the optical waveguide by the surface acoustic wave, the light leaving the optical waveguide and then exiting the substrate at the exit face; and
   a diffractive optic on the exit face for conditioning the light exiting the substrate;
   wherein the diffractive optic is transmissive to the light and is formed on a distal face of the substrate which is opposite a proximal face of the substrate, the optical waveguide being fabricated in the proximal face, with the light exiting the substrate at the distal face.

2. A modulator as claimed in claim 1, wherein the diffractive optic is a grating.

3. A modulator as claimed in claim 1, further comprising an array of the diffractive optics.

4. A modulator as claimed in claim 1, wherein the diffractive optic increases an exit angle fan of the light from the substrate.

5. A method for steering light, comprising:
   coupling light into an optical waveguide in a substrate with an incoupling device;
   generating a surface acoustic wave in the substrate that diffracts the light from the optical waveguide by polarization-rotating the light out of a guided mode and into a leaky mode of the optical waveguide so that the light exits the optical waveguide and then exits the substrate;
   conditioning a light exiting from the substrate with a diffractive optic on an exit face of the substrate;
   wherein the diffractive optic is transmissive to the light and is formed on a distal face of the substrate which is opposite a proximal face of the substrate, the optical waveguide being fabricated in the proximal face, with the light exiting the substrate at the distal face.

\* \* \* \* \*